(12) United States Patent
An et al.

(10) Patent No.: US 11,419,229 B1
(45) Date of Patent: Aug. 16, 2022

(54) LEAF SPRING LATCH

(71) Applicant: ZT Group Int'l, Inc., Secaucus, NJ (US)

(72) Inventors: Chen An, Bergenfield, NJ (US); Maheshkumar Varrey, Rutherford, NJ (US); Zichun Song, Bergenfield, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 156 days.

(21) Appl. No.: 16/406,548

(22) Filed: May 8, 2019

(51) Int. Cl.
*H05K 5/02* (2006.01)
*H05K 7/14* (2006.01)

(52) U.S. Cl.
CPC ......... *H05K 5/0221* (2013.01); *H05K 7/1489* (2013.01); *H05K 7/1487* (2013.01)

(58) Field of Classification Search
CPC ... H05K 5/0221; H05K 7/1489; H05K 7/1487
USPC .............. 248/685, 686, 617, 221.11, 222.11, 248/225.21, 235
See application file for complete search history.

(56) References Cited

U.S. PATENT DOCUMENTS

| | | | | |
|---|---|---|---|---|
| 7,357,362 B2 * | 4/2008 | Yang | ..................... | H05K 7/1489 248/220.22 |
| 7,542,271 B2 * | 6/2009 | Chen | ....................... | G06F 1/187 248/221.11 |
| 7,575,203 B2 * | 8/2009 | Lan | ......................... | G06F 1/187 248/220.21 |
| 7,703,734 B2 * | 4/2010 | Chen | ...................... | A47B 88/43 248/298.1 |
| 8,231,188 B1 * | 7/2012 | Chen | ..................... | H05K 7/1489 312/333 |
| 8,243,432 B2 * | 8/2012 | Duan | ................... | H05K 5/0234 361/679.3 |
| 8,295,044 B2 * | 10/2012 | Chen | ....................... | G06F 1/187 361/679.33 |
| 8,353,494 B2 * | 1/2013 | Peng | ..................... | H05K 7/1489 248/298.1 |
| 8,544,801 B2 * | 10/2013 | Ting | ........................ | G06F 1/187 248/27.3 |
| 8,967,565 B2 * | 3/2015 | Chen | ...................... | A47B 88/43 248/221.11 |
| 10,376,054 B1 * | 8/2019 | Chen | ...................... | A47B 88/50 |
| 11,009,069 B1 * | 5/2021 | Chen | ...................... | A47B 88/48 |
| 2008/0203251 A1 * | 8/2008 | Chen | ..................... | H05K 7/1489 248/200 |
| 2010/0294905 A1 * | 11/2010 | Peng | ....................... | G06F 1/187 248/222.12 |
| 2011/0192946 A1 * | 8/2011 | Yu | ........................ | H05K 7/1489 248/222.11 |
| 2013/0168337 A1 * | 7/2013 | Zhou | ....................... | G06F 1/183 211/26 |
| 2015/0069196 A1 * | 3/2015 | Chen | .................. | A47B 47/0058 248/218.4 |
| 2015/0359123 A1 * | 12/2015 | Hsu | ...................... | H05K 7/1489 248/222.11 |

(Continued)

*Primary Examiner* — Terrell L McKinnon
*Assistant Examiner* — Michael McDuffie
(74) *Attorney, Agent, or Firm* — Todd A. Noah; Dergosits & Noah LLP

(57) ABSTRACT

A latch includes a housing, a leaf spring, a tooth, and an actuator. Motion of the actuator against the leaf spring causes the leaf spring to deform and the tooth to extend from the housing to engage a keeper.

16 Claims, 18 Drawing Sheets

(56) References Cited

U.S. PATENT DOCUMENTS

| 2018/0070724 | A1* | 3/2018 | Chen | A47B 57/34 |
| 2018/0220797 | A1* | 8/2018 | Chen | A47B 88/423 |
| 2019/0373759 | A1* | 12/2019 | Chen | H05K 7/183 |
| 2020/0137920 | A1* | 4/2020 | Chen | A47B 88/43 |

* cited by examiner

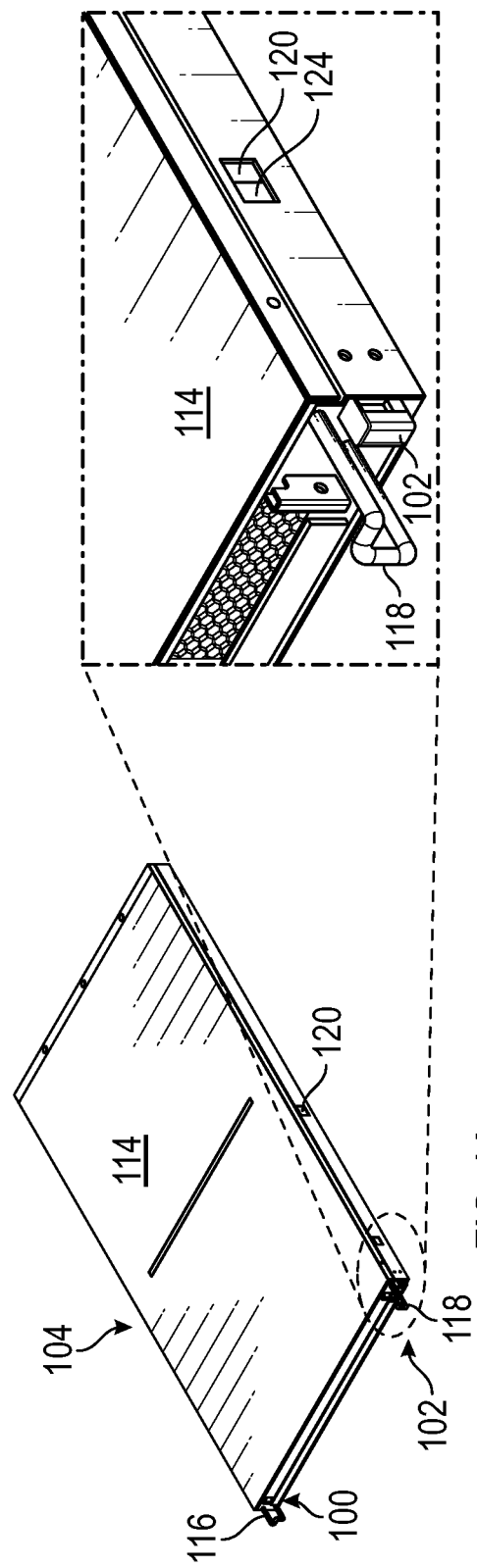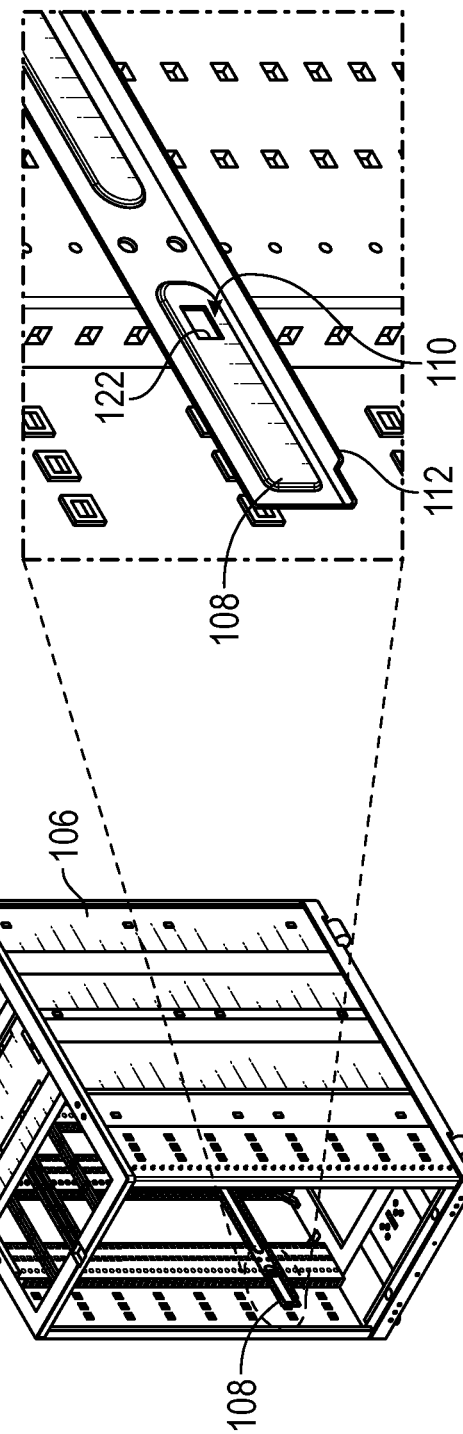

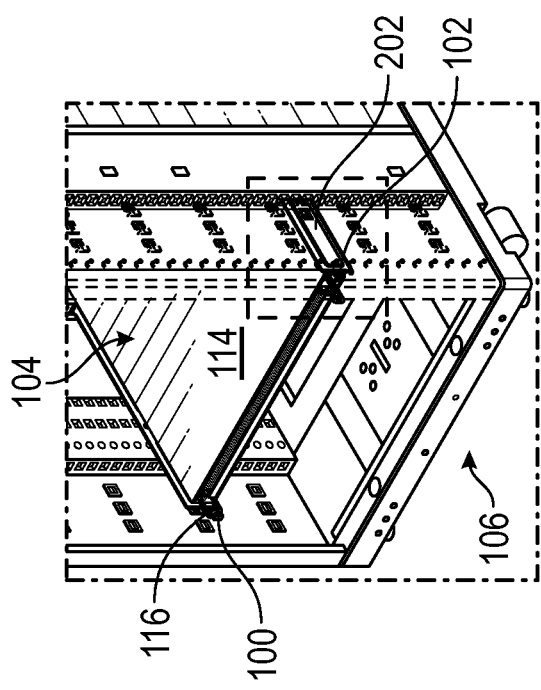
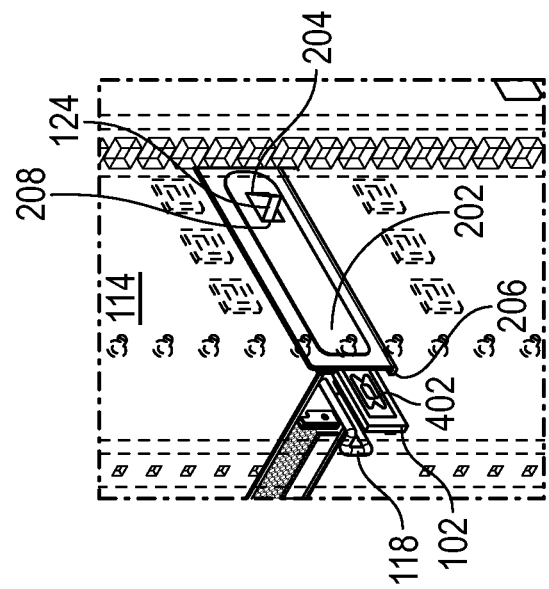
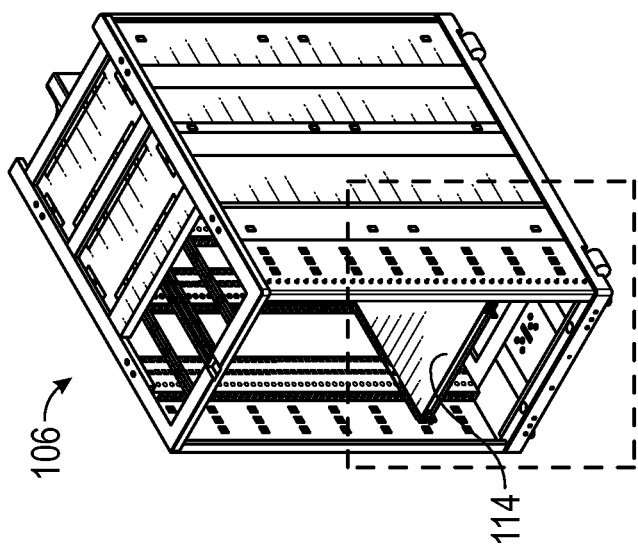
FIG. 2B
FIG. 2C
FIG. 2A

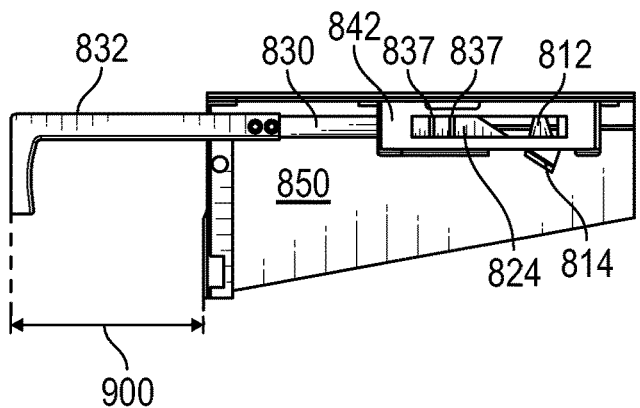
FIG. 9A
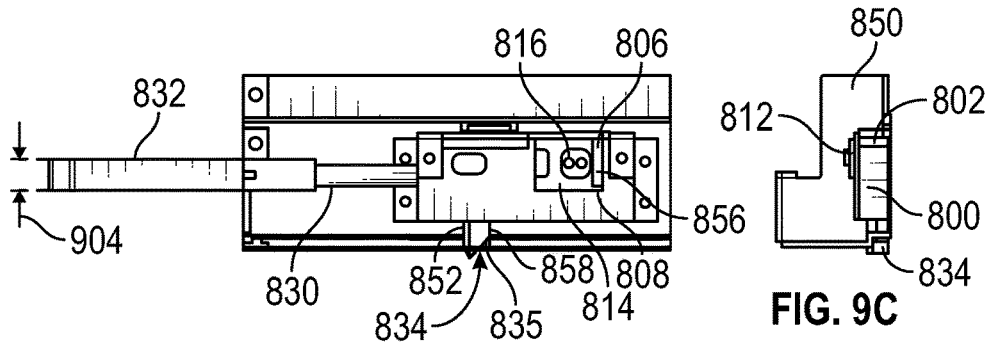
FIG. 9B
FIG. 9C
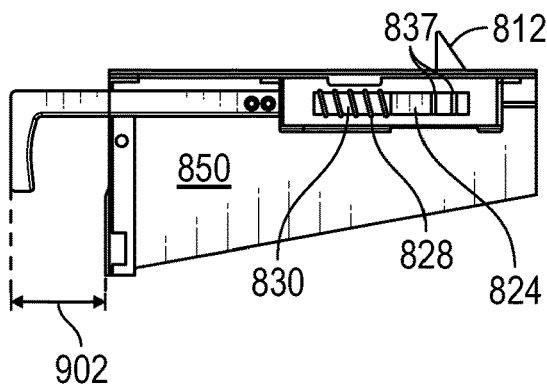
FIG. 9D
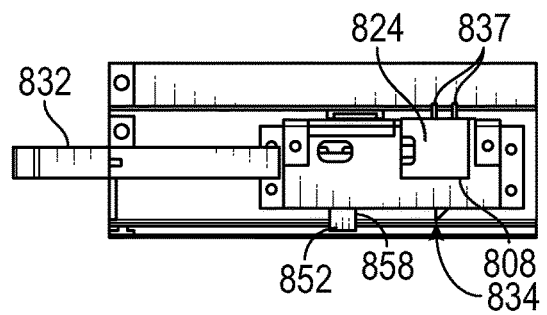
FIG. 9E
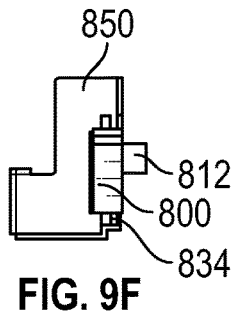
FIG. 9F

LEAF SPRING LATCH

BACKGROUND

Existing latches for securing blade servers within server racks may not withstand seismic events, or may occupy more room within the blade server than is desirable, or both. Latches available currently that employ leaf springs engage the server rack using a hook made from the same or similar material as the leaf spring, which is thin.

What is needed is a latch that can firmly secure a server (e.g., a blade server weighing perhaps 50 lbs) within a rack even during seismic events and that also occupies as little space as possible. A further desired feature is that the latch is relatively easy to open and close.

BRIEF DESCRIPTION OF THE DRAWINGS

The embodiments are illustrated by way of example and not limitation in the figures of the accompanying drawings, in which like references indicate similar elements, and in which:

FIG. 1A is a perspective view of a blade server with a first embodiment of a latch;

FIG. 1B is an expanded view of the circled section of FIG. 1A;

FIG. 1C is a perspective view of a server rack;

FIG. 1D is an expanded view of the circled section of FIG. 1C;

FIG. 2A is a perspective view of a server rack with a server installed;

FIG. 2B is an expanded view of the indicated section of FIG. 2A with part of the server rack rendered transparent to show aspects of the first embodiment of a latch;

FIG. 2C is an expanded view of the indicated section of FIG. 2B with part of the server rack rendered transparent to show aspects of the first embodiment of a latch;

FIG. 9A is a top view of the second embodiment of a latch in an open state and a section of a chassis;

FIG. 9B is a right-side view of the second embodiment of a latch in an open state and a section of a chassis;

FIG. 9C is a rear view of the second embodiment of a latch in an open state and a section of a chassis;

FIG. 9D is a top view of the second embodiment of a latch in a closed state and a section of a chassis;

FIG. 9E is a right-side view of the second embodiment of a latch in a closed state and a section of a chassis;

FIG. 9F is a rear view of the second embodiment of a latch in a closed state and a section of a chassis;

DETAILED DESCRIPTION

Figure 3A:
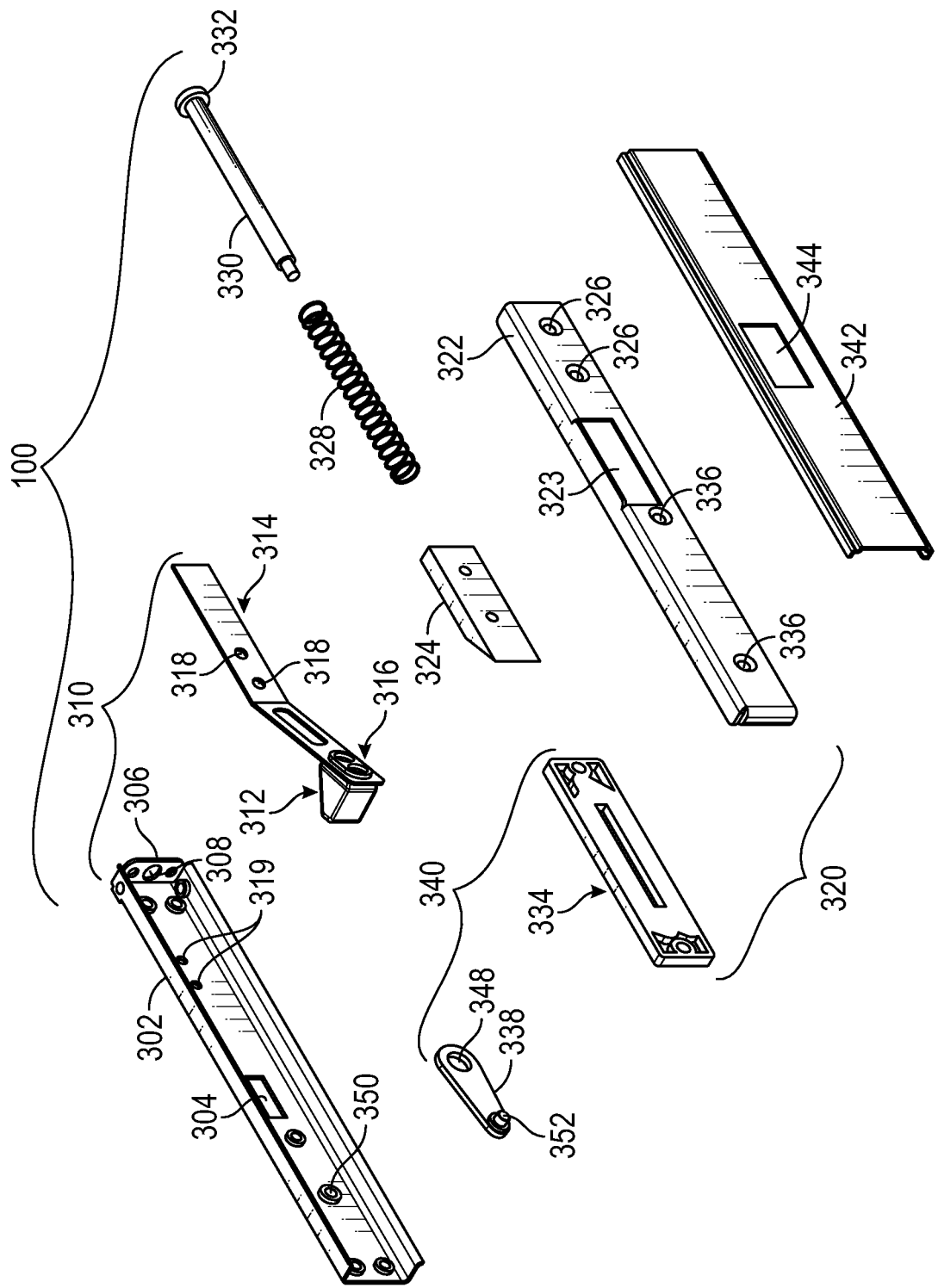
FIG. 3A is an expanded assembly drawing of the first embodiment of a latch.

The subject matter discloses embodiments of a latch designed to retain a server, e.g., a 50 lb blade server, within a server rack. Embodiments incorporate a leaf spring, which is deformed or undeformed ("relaxed") by the movement of an actuator. Outward movement of the leaf spring causes a tooth connected to the leaf spring to be extended from the server chassis and engage a keeper slot in a shelf (or "friction rail") of the server rack. Embodiments designed around a leaf spring save space inside the chassis giving more room to connectors and PCBs. The various parts of embodiments may be constructed of sheet metal or die cast, and may have varying thicknesses. In an embodiment, the structure of the tooth is a robust wedge, being a die cast part, as opposed to being a hook made, e.g., of the same thin material as the leaf spring.

In a first embodiment, described with reference to FIGS. 1A-7C, a handle is equipped with a push-to-trigger that causes the actuator to be retained in designated positions. A spring urges the handle toward the closed position, in which the handle is extended from the chassis and the tooth is extended into the keeper. The trigger mechanism includes a cam-shaped arm with a pin at one end that follows a complex groove, which together work as a push-to-trigger mechanism aiding in opening and closing of the latch. In the embodiment, after the user installs the server in a rack shelf, the user pushes on the handle to release it forward and close the latch, fixing the server in place. Pushing the handle when the latch is open (or "unlocked") kicks the trigger mechanism from an open (or "unlocked") position, to a closed (or "locked") position, sliding the actuator over the leaf spring, which deforms the leaf spring and causes the tooth to extend from server chassis to engage the keeper. Pushing the handle when the latch is closed kicks the trigger mechanism from the closed position to the open position, the movement causing the actuator to slide from over the leaf spring and allow the leaf spring to relax, which draws the tooth back within the server chassis.

In embodiments, when the latch is closed the actuator is positioned behind the tooth and the leaf spring. The presence of the actuator behind the tooth and leaf spring reinforces the leaf spring and hinders the disengagement of the latch during impact or vibration. Thus, the position of the actuator behind the tooth and leaf spring helps the latch survive harsh impact loads that may be generated during transportation or seismic activity. This is unlike leaf spring latches that depend on the action of the leaf spring alone to maintain being engaged.

In embodiments, when the latch is open the tooth is retracted into the server chassis, which keeps the tooth from grabbing exposed cables.

In an embodiment, a pull-to-trigger mechanism, similar to the push-to-trigger mechanism described within, may be used.

A second embodiment, described with reference to FIG. 8A through FIG. 10E, uses the leaf spring and actuator of the first embodiment and adds an auto-close feature instead of the push-to-trigger or pull-to-trigger mechanism. With the second embodiment, the server may be pulled out of the rack by just pulling on the latch handles. And the server may be re-installed by just pushing the server back into the rack, which triggers the auto-close feature, securely fixing the server in the rack.

FIG. 1A is a perspective view of a blade server 104 with the first embodiment of a latch 100 (left side) or 102 (right side). In the embodiment, latch 102 is a mirror-image of latch 100. Server 104 includes a chassis 114 and chassis handles 116 and 118. Chassis 114 includes the outer shell of server 104 and has a window or "cutout" 120 on the right side. Handles 116 and 118 are used when inserting or removing server 104 from a server rack 106.

FIG. 1B is an expanded view of the circled section of FIG. 1A. In FIG. 1B, part of latch 102 protrudes from the front of chassis 114. Latch 102 includes a tooth 124 (also known as a "hook") which is visible through window 120 in chassis 114.

FIG. 1C is a perspective view of server rack 106. Server rack 106 includes a rail 108 (or "friction rail") on which server 104 slides when installed into rack 106. A second rail (not shown) is positioned on the opposite side of rack 106. The interaction between rail 108, server 104, and latch 100 on the left of rack 106 is mirrored by the interaction between latch 102, server 104, and the rail on the right side of rack 106.

FIG. 1D is an expanded view of the circled section of FIG. 1C. In FIG. 1D, rail 108 is shown to include a flange 112 for supporting the left side of server 104 and a window or "cutout" 122. Window 110 is dimensioned to receive a tooth 312 (FIG. 3A) of latch 100. Tooth 312, when extended from server 104, engages an edge 122 of window 110 to prevent server 104 from being withdrawn from rack 106. Tooth 124 engages a similar window in a shelf on the right side of rack 106.

FIG. 2A is a perspective view of server rack 106 with server 104 installed and retained by latches 100 and 102. FIG. 2B is an expanded view of the indicated section of FIG. 2A with part of server rack 106 rendered transparent to show aspects of latch 102. FIG. 2C is an expanded view of the indicated section of FIG. 2B with part of server rack 106 rendered transparent to show aspects of latch 102. In FIG. 2C, chassis 114 has been installed in rack 106 and is supported by a flange 206 of a rail 202. Part of latch 102 is shown to extend from chassis 114 to approximately the same distance as handle 118, which indicates that latch 102 is in the closed position. In confirmation of latch 102 being in the closed position, tooth 124 is extended through a window 204 of rail 202. In this closed position, tooth 124 prevents chassis 114 from being withdrawn from rack 106 by engaging an edge 208 of window 204.

FIG. 3A is an expanded assembly drawing of latch 100. In this embodiment, latch 102 is a mirror image of latch 100. Thus, the description of latch 100 applies equally to latch 102. In FIG. 3A, a tooth assembly 310 includes a tooth 312 attached to a leaf spring 314 partly using a washer 316. Leaf spring 314 has holes 318 for fasteners to attach tooth assembly 310 to corresponding holes 319 in a housing 302. Leaf spring 314 includes a bend between holes 318 and tooth 312. In this configuration, when tooth assembly 310 is mounted to housing 302, tooth 312 is positioned at, but does not protrude through a window 304 in housing 302. When leaf spring 314 is deformed by being flattened, tooth 312 passes through window 304 to engage the corresponding latch keeper, i.e., edge 122 of window 110 (FIG. 1D). Housing 302 further includes an end plate 306 with a hole 308 and a pivot point 350.

Latch 100 further includes a handle assembly 320 with a handle or "slider" 322, an actuator or "wedge" 324, a spring 328, a guide pin 330 with a guide pin head 332, and a pin track 334. In handle assembly 320 actuator 324 is connected to handle 322 using holes 326 with appropriate fasteners. Pin track 334 is connected to handle 322 using holes 336 and appropriate fasteners. Handle assembly 320 is connected to housing 302 by passing guide pin 330 through end plate hole 308, placing spring 328 about guide pin 330, and screwing guide pin 330 into one end of actuator 324.

Latch 100 includes an arm 338 with a pin 352 at one end and a hole 348 at the other end. Arm 338 is sandwiched between latch assembly 320 and housing 302. Hole 348 receives pivot point 350, which allows arm 338 to pivot about point 350. Pin 352 engages pin track 334. A groove 402 (FIG. 4A-4D), within which pin 352 travels, cannot be seen in FIG. 3A. Handle assembly 320 is itself sandwiched between housing 302 and a cover 342.

Thus assembled, handle assembly 320 is constrained to move linearly, sandwiched between housing 302 and cover 342, with spring 328 urging handle assembly 320 forward with respect to chassis 114. The travel of handle assembly 320 forward is limited by guide pin head 332 coming against end plate 306 and limited to the right by actuator 324 compressing spring 328 against end plate 306.

Latch 100 is opened by causing handle assembly 320 to travel rearward with respect to chassis 114. At the limit of the travel rearward, actuator 324 has compressed spring 328 against end plate 306, with handle window 323 aligning with housing window 304 and cover window 344. In addition, actuator 324 is positioned next to holes 318, which allows leaf spring 314 to return to its undeformed (or "less-deformed") shape and retract tooth 312 from housing window 304. Tooth 312 extends in the other direction through handle window 323 and cover window 344.

Latch 100 is closed by causing handle assembly 320 to travel forward with respect to chassis 114. At the limit of the travel forward (limited by guide pin head 332), actuator 324 has moved behind leaf spring 314, causing leaf spring 314 to deform and push tooth 312 through housing window 304.

Figure 3B:
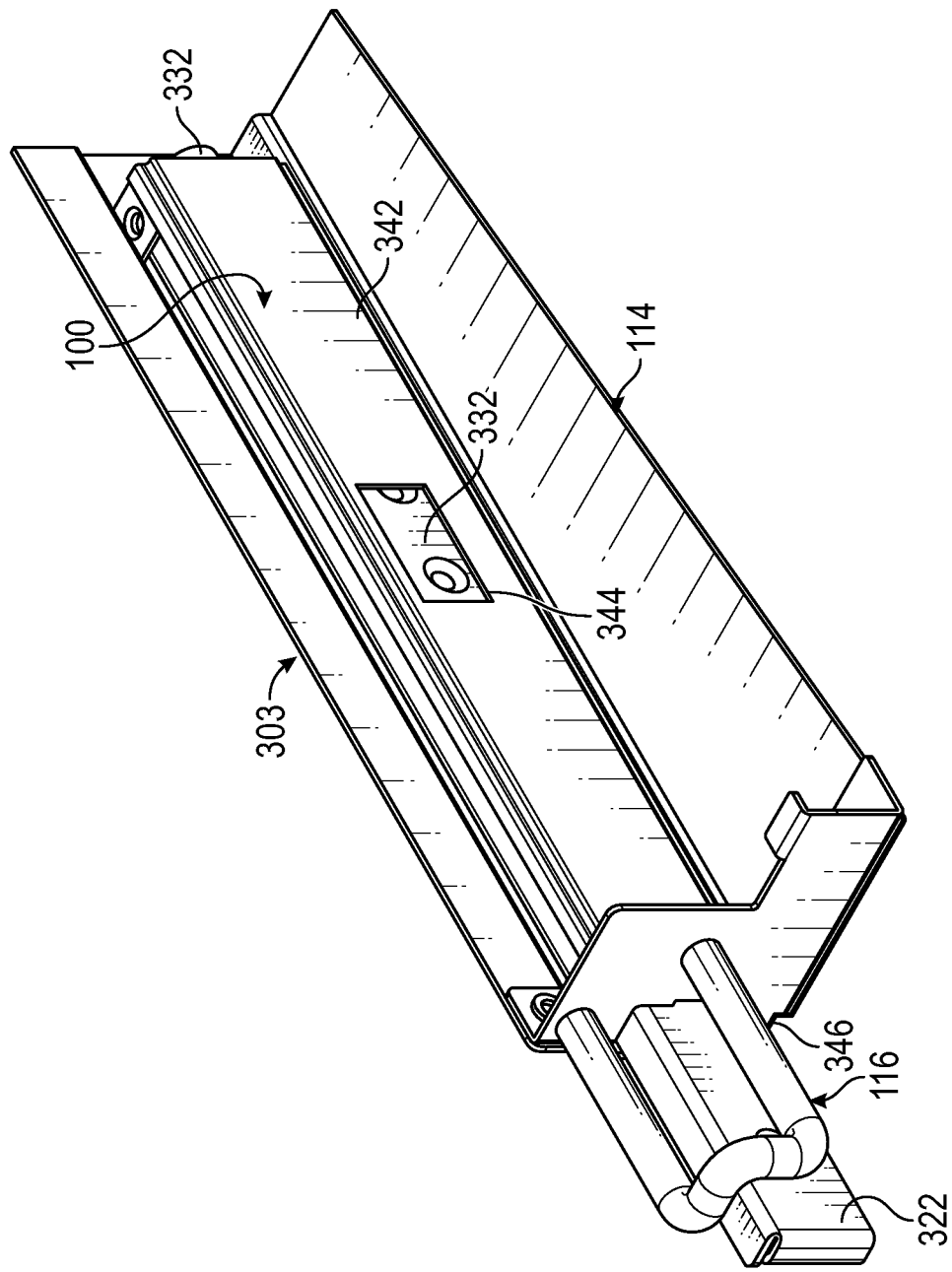
FIG. 3B is a perspective view of the first embodiment of a latch and a section of a server chassis.

FIG. 3B is a perspective view of latch 100 and a section of server chassis 114. In FIG. 3B, latch 100 is in the closed position with handle 322 extending fully from chassis 114 through a chassis window 346 in the front of chassis 114. The extension of handle 322 is limited by guide pin head 332. Holes 326 of handle 322 can be seen through cover window 344, indicating that actuator 324 has caused leaf spring 314 to deform and tooth 312 to extend from the other side of chassis 114.

In an embodiment, the thickness of leaf spring 314 may vary from 0.6 mm to 0.8 mm depends on the server chassis weight. The material of leaf spring 314 may be stainless steel 303 or other material with an elastic modulus of approximately 200,000 MPa and a yield strength equal to or greater than 380 MPa. Materials of such strength may help the latch-spring survive seismic loadings.

Figure 4A:
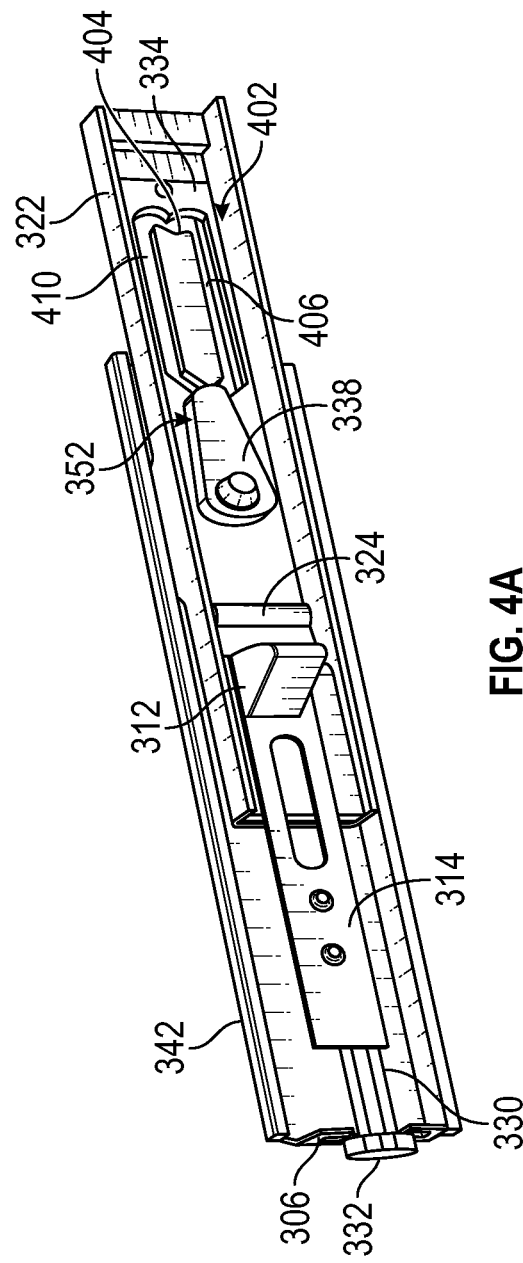
FIG. 4A is a perspective view of the first embodiment of a latch with part of the latch rendered invisible to illustrate the inner workings in a closed state.

FIG. 4A is a perspective view of latch 100 with most of housing 302 rendered invisible to illustrate the inner workings in a closed state. In FIG. 4A through FIG. 4D, chassis 114 and housing 302 have been rendered invisible (except for housing end plate 306) to show the interaction between arm 338 and groove 402 and between actuator 324 and leaf spring 314, as latch 100 cycles from closed (FIG. 4A), to an intermediate state (FIG. 4B), to open (FIG. 4C), to an intermediate state (FIG. 4D). FIGS. 4A-4D show the side of track 334 that was obscured in previous figures. Track 334 includes groove 402 that is followed by pin 352 in a clockwise direction as seen in these figures. Pin 352 is now on the obscured side of arm 338. Groove 402 includes, in order of pin travel, a pin-retaining position 408, an upper groove segment 410, a pin-retaining position 404, and a lower groove segment 408. Pin-retaining positions 404 and 408 are stable positions in which pin 352 will remain until handle 322 is depressed enough to initiate movement of pin 352 to the next groove segment. Since arm 338 is connected at one end to housing 302 (with hole 348 pivoting about pivot point 350 of housing 302) and is connected at the other end to handle assembly 320 (with pin 352 travelling within groove 402 of track 334), it is the motion of pin 352 within groove 402 that controls the relative motion of handle assembly 320 with respect to housing 302 and chassis 114.

In FIG. 4A, latch 100 is closed, which is indicated by handle 322 and tooth 312 being fully extended in their respective directions. The full extension of handle 322 is indicated by guide pin head 332 being up against end plate 306 and arm 338 being positioned with pin 352 within pin-retaining position 408—the "closed" pin-retaining position. Pin-retaining position 408 is the "closed" pin-retaining position because in this position handle 322 is fully extended, which caused actuator 324 to have moved completely behind leaf spring 314 and tooth 312, causing leaf spring 314 to deform and extend tooth 312 fully outward with respect to chassis 114 (or forward in this view). In this closed state, tooth 312 is prevented from retracting by the bracing of actuator 324, which is between tooth 312 and leaf spring 314 on one side, and handle 322 on the other side. In this closed state, tooth 312 extends from chassis 114 and would engage, e.g., edge 122 of shelf window 110. Thus, with latch 100 closed, server 104 may not be withdrawn from rack 106.

Figure 4B:
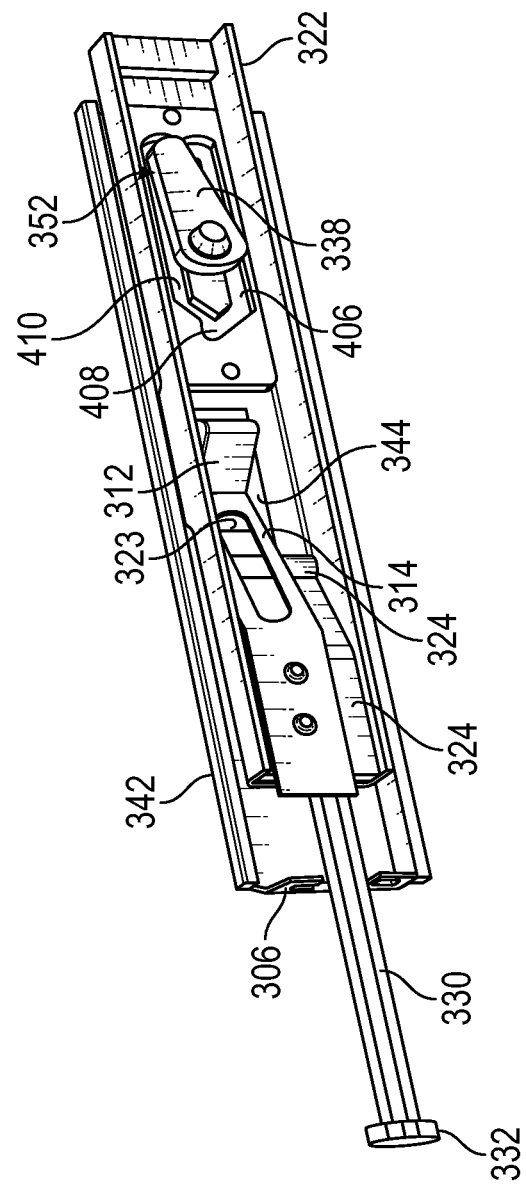
FIG. 4B is a perspective view of the first embodiment of a latch part of the latch rendered invisible to illustrate the inner workings in an intermediate state.

FIG. 4B is a perspective view of latch 100 with most of housing 302 rendered invisible to illustrate the inner workings in an intermediate state. In FIG. 4B, handle 322 has been significantly depressed from its position in FIG. 4A, causing groove 402 to move to the left, displacing pin 352 from pin-retaining position 408 and causing pin 352 to follow upper groove segment 410. With the movement of handle 322, actuator 324 moved left and emerged from behind tooth 312, which allowed leaf spring 314 to return to its less or undeformed state and retract tooth 312 partially through handle window 323 and also cover window 344.

Figure 4C:
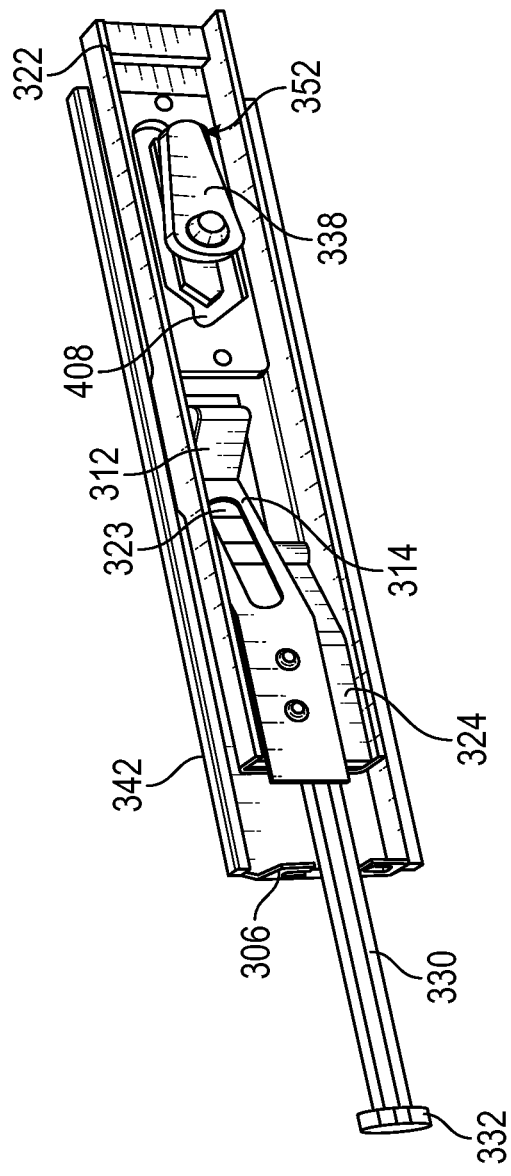
FIG. 4C is a perspective view of the first embodiment of a latch with part of the latch rendered invisible to illustrate the inner workings in an open state.
Figure 4D:
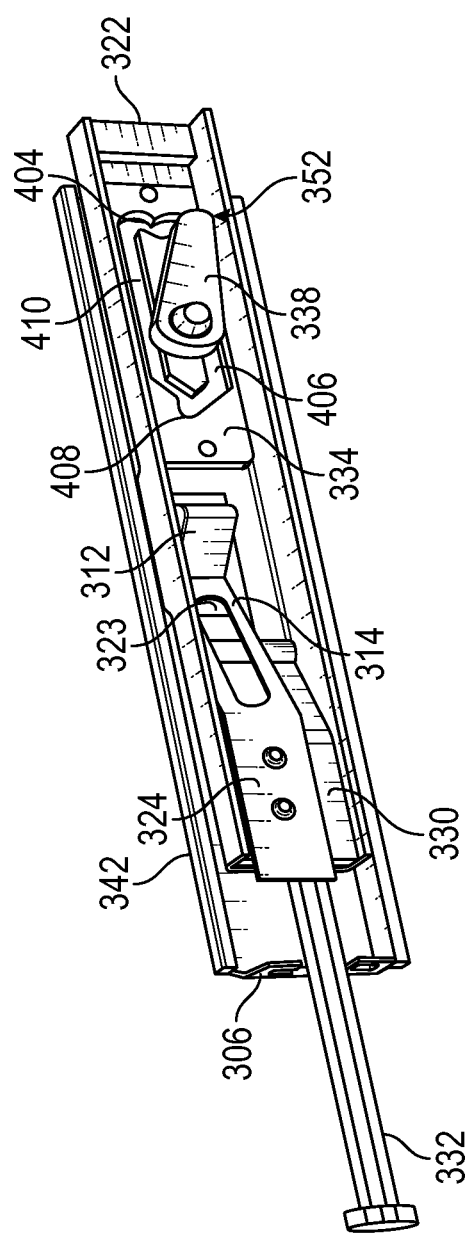
FIG. 4D is a perspective view of the first embodiment of a latch with part of the latch rendered invisible to illustrate the inner workings in an intermediate state.

FIG. 4C is a perspective view of latch 100 with most of housing 302 rendered invisible to illustrate the inner workings in an open state. In FIG. 4C, latch 100 is open, which is indicated by handle 322 being fully depressed and tooth 312 being fully retracted. The full depression of handle 322 is indicated by arm 338 being positioned with pin 352 within pin-retaining position 404—the "open" pin-retaining position. Pin-retaining position 404 is the "open" pin-retaining position, since in this position, with handle 322 is fully depressed, actuator 324 is moved from behind tooth 312 and much of leaf spring 314, allowing leaf spring 314 to return to its undeformed state and retract tooth 312, which is shown retracted partially through handle window 323 and also through cover window 344. In this open state, tooth 312 is retracted within chassis 114 and would not engage, e.g., edge 122 of shelf window 110. Thus, with latch 100 in an open state, server 104 may be withdrawn from rack 106.

FIG. 4D is a is a perspective view of latch 100 with most of housing 302 rendered invisible to illustrate the inner workings in an intermediate state. In FIG. 4D, handle 322 has been slightly depressed from its position in FIG. 4C, causing groove 402 to move to the left, displacing pin 352 from pin-retaining position 404 and causing pin 352 to drop to follow lower groove segment 406. With this movement of handle 322, actuator 324 moved slightly left further from tooth 312, which allowed leaf spring 314 to remain in its undeformed state and allowed tooth 312 to remain partially through handle window 323 and also cover window 344. However, if handle 322 is released from the position shown in FIG. 4D, spring 328 will force pin 352 to travel along groove segment 406 and actuator 324 to deform leaf spring 314, which will return latch 100 to the configuration shown in FIG. 4A.

Figure 5A:
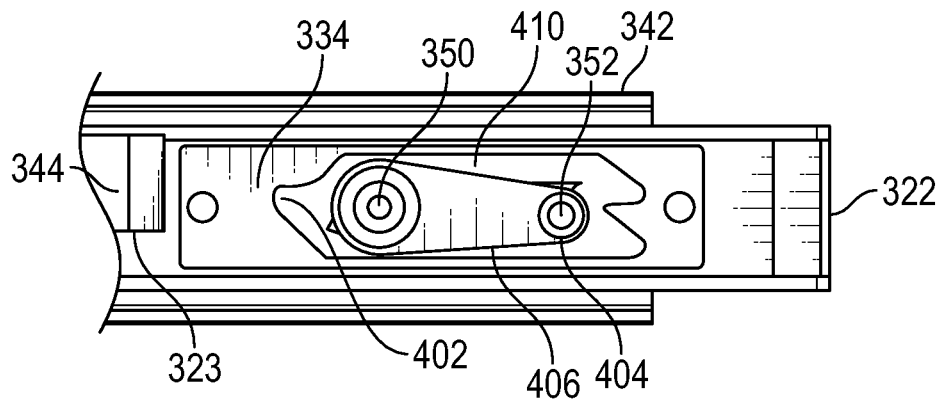
FIG. 5A is a left-side view of a section of the first embodiment of the latch with a part of the latch rendered invisible to illustrate the inner workings in an open state.
Figure 5B:
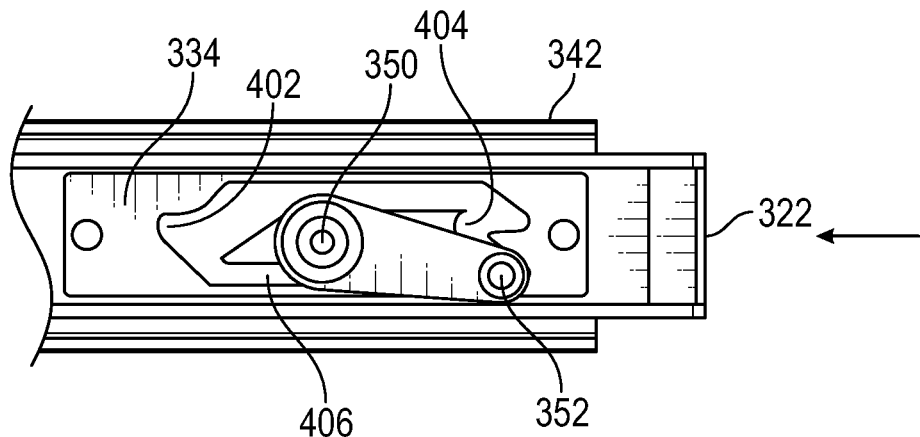
FIG. 5B is a left-side view of a section of the first embodiment of the latch with part of the latch rendered invisible to illustrate the inner workings in an intermediate state.
Figure 5C:
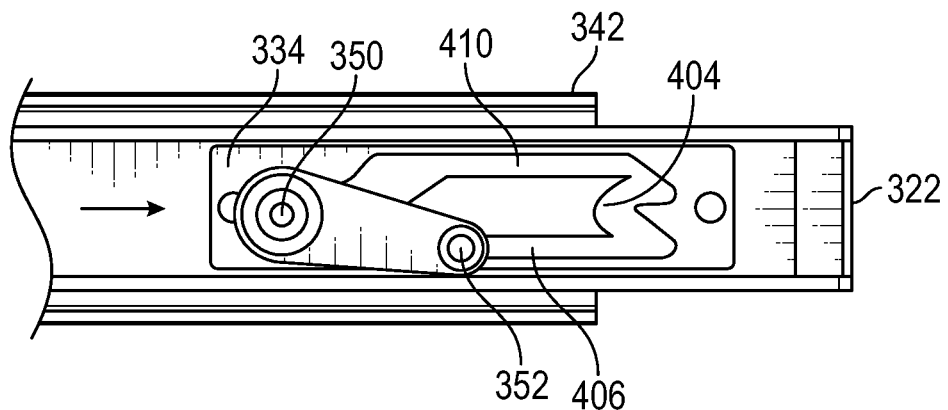
FIG. 5C is a left-side view of a section of the first embodiment of the latch with part of the latch rendered invisible to illustrate the inner workings in an intermediate state.
Figure 5D:
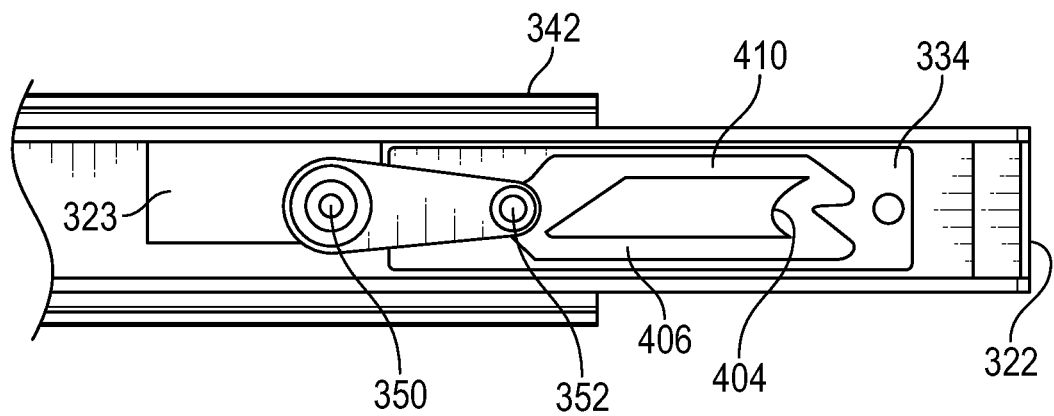
FIG. 5D is a left-side view of a section of the first embodiment of the latch with part of the latch rendered invisible to illustrate the inner workings in a closed state.
Figure 5E:
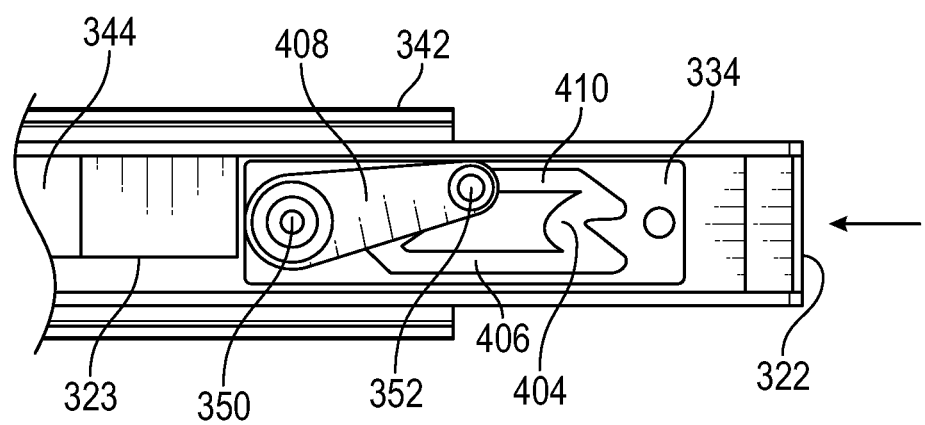
FIG. 5E is a left-side view of a section of the first embodiment of the latch with part of the latch rendered invisible to illustrate the inner workings in an intermediate state.

FIG. 5A through FIG. 5E further depict the interaction between pin 352 of arm 338 and groove 402, with arm 338 rendered in outline form to shown the details of pin 352 and pivot point 350, as latch 100 cycles from open (FIG. 5A), to an intermediate state (FIG. 5B), to a second intermediate state (FIG. 5C), to closed (FIG. 5D), to a third intermediate state (FIG. 5E).

FIG. 5A is a left-side view of a section of latch 100 in the open state. The configuration of FIG. 5A corresponds to the configuration and description of FIG. 4C. In FIG. 5A, pin 352 is engaging track 402 in pin-retaining position 404. In this position, spring 328 (FIG. 3) is compressed between actuator 324 and endplate 306. The compressive force urges track 334 to the right (or "forward" with respect to chassis 114) and causes pin 352 to be stably retained within the depression of pin-retaining position 404.

FIG. 5B is a left-side view of a section of latch 100 in an intermediate state. The configuration of FIG. 5B corresponds to the configuration and description of FIG. 4D. In FIG. 5B, handle 322 has been depressed in the direction of the arrow, which allowed pin 352 to drop from pin-retaining position 404 into lower groove segment 406. In this position, spring 328 (FIG. 3) is still compressed between actuator 324 and endplate 306 and if handle 322 is released it will travel to the right to the extent allowed by guide pin head 332.

FIG. 5C is a left-side view of a section of latch 100 in an intermediate state. In FIG. 5C, handle 322 has been partially released, which allowed pin 352 to travel approximately half-way along lower groove segment 406.

FIG. 5D is a left-side view of a section of latch 100 in the closed state. The configuration of FIG. 5D corresponds to the configuration and description of FIG. 4A. In FIG. 5D, handle 322 has traveled to the right (or "forward" with respect to chassis 114) to the extent allowed by pin 352 and groove 402. Pin 352 is engaging track 402 in pin-retaining position 402. In this position, spring 328 (FIG. 3) is in a less-compressed state between actuator 324 and endplate 306. Still, the compressive force urges track 334 to the right and causes pin 352 to be retained within the depression of pin-retaining position 402.

FIG. 5E is a left-side view of a section of latch 100 in an intermediate state. In FIG. 5E, handle 322 has been partially compressed, which caused pin 352 to travel approximately one-third of the way along upper groove segment 410.

Figure 5F:
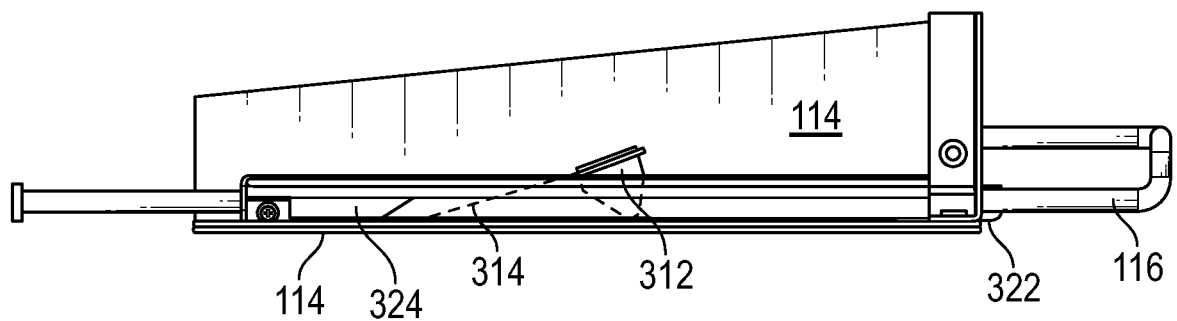
FIG. 5F is a top view of the first embodiment of the latch and a section of a chassis with part of the latch rendered invisible to illustrate the inner workings in the state of FIG. 5A.

FIG. 5F is a top view of latch 100 a section of chassis 114 with part of latch 100 rendered invisible to further illustrate configuration shown in FIG. 5A. The configuration of FIG. 5F also corresponds to the configuration and description of FIG. 4C. FIG. 5F further illustrates that when leaf spring 314 is in the undeformed state, both it and tooth 312 retract through handle window 323 and cover window 334 to the interior of chassis 114.

Figure 5G:
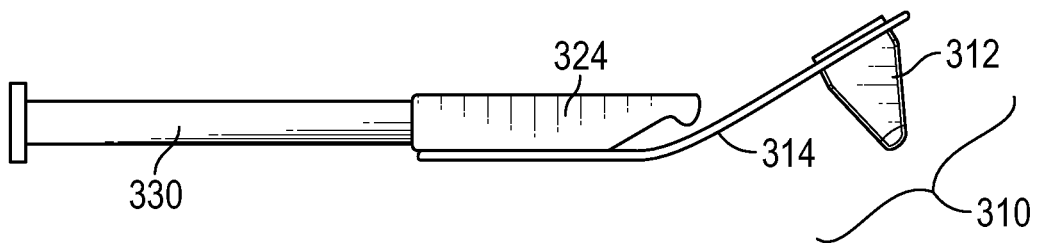
FIG. 5G is a top view of the first embodiment of the latch and a section of a chassis with part of the latch rendered invisible to illustrate the inner workings in the state of FIG. 5A.

FIG. 5G is a top view of tooth assembly 310, actuator 324, and guide pin 330 in the configuration shown in FIG. 5A and FIG. 5F. The configuration of FIG. 5G corresponds to the configuration and description of FIG. 4C. FIG. 5G further illustrates the shape of leaf spring 314 in the undeformed state.

Figure 5H:
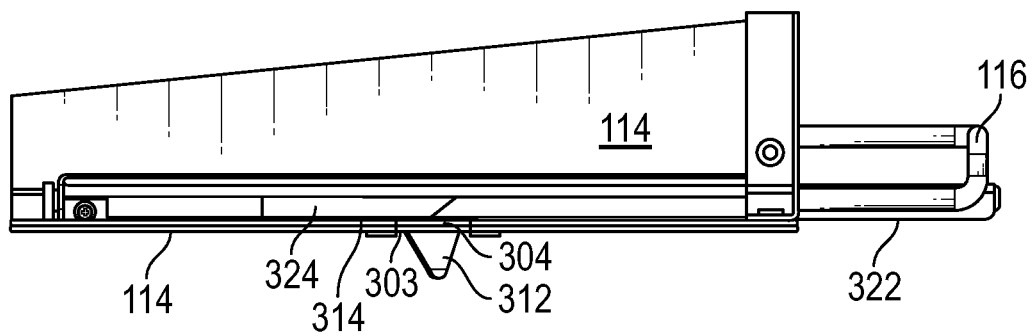
FIG. 5H is a top view of the first embodiment of the latch and a section of a chassis with part of the latch rendered invisible to illustrate the inner workings in the state of FIG. 5D.

FIG. 5H is a top view of latch 100 a section of chassis 114 with part of latch 100 rendered invisible to further illustrate configuration shown in FIG. 5D. The configuration of FIG. 5H also corresponds to the configuration and description of FIG. 4A. FIG. 5H further illustrates that deformation of leaf spring 314 by actuator 324 causes tooth 312 to extend through housing window 304 and a window 303 in chassis 114 (see window 120 for the equivalent window for latch 102) to the exterior of chassis 114. With actuator 324 being positioned behind tooth 312, and positioned between tooth 312 and handle 322 and cover 342, tooth 312 is constrained to remain in the extended position shown. In addition, leaf spring 314 itself is constrained between actuator 324 and housing 302, which increases the ability of leaf spring 312 to resist damaging compressive forces in the direction of travel of handle 322. These both increase the ability of tooth 312 to remain in the closed position and prevent the undesired removal of server 104 from rack 106.

Figure 5I:
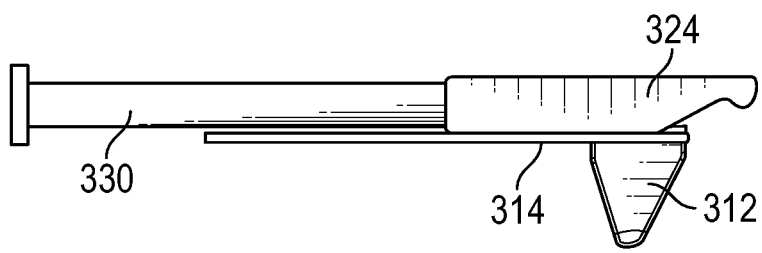
FIG. 5I is a top view of the first embodiment of the latch and a section of a chassis with part of the latch rendered invisible to illustrate the inner workings in the state of FIG. 5D.

FIG. 5I is a top view of tooth assembly 310, actuator 324, and guide pin 330 in the configuration shown in FIG. 5D and FIG. 5H. The configuration of FIG. 5I corresponds to the configuration and description of FIG. 4A. FIG. 5I further illustrates the shape of leaf spring 314 in the deformed state and the position of actuator 324 behind tooth 312 that causes such deformation. In addition, the position of actuator 324 behind leaf spring 314, which sandwiches a portion of leaf spring 314 against housing 302 (not shown) is further illustrated.

Figure 6A:
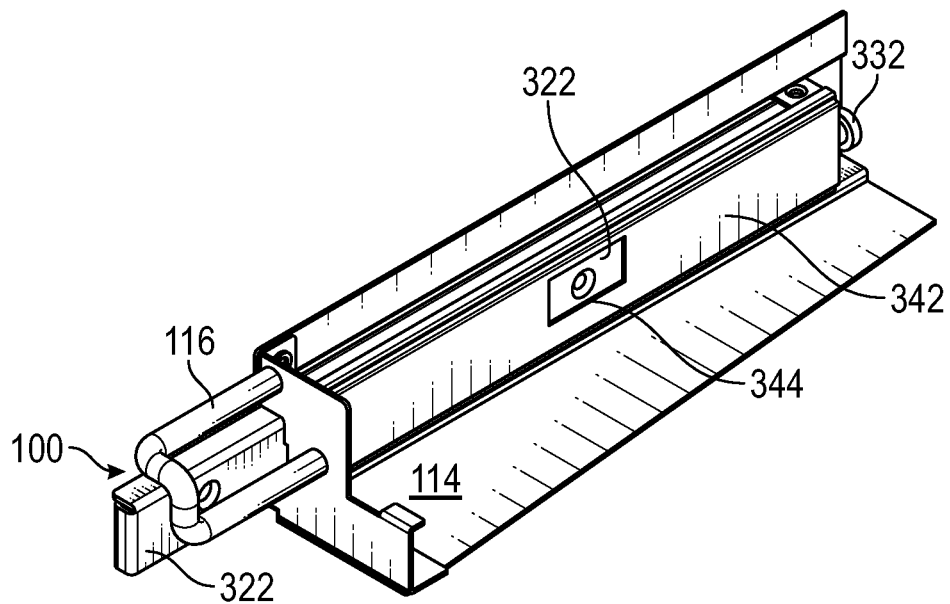
FIG. 6A is an upper right-side perspective view of the first embodiment of a latch in a closed state and a section of a chassis.

FIG. 6A is an upper right-side perspective view of latch 100 in a closed state and a section of chassis 114. The configuration of FIG. 6A corresponds to the configuration and description of FIGS. 4A, 5D, 5H, and 5I. FIG. 6A illustrates that in the closed position, handle 322 blocks cover window 344, preventing leaf spring 314 and tooth 312 from retracting through cover window 344.

Figure 6B:
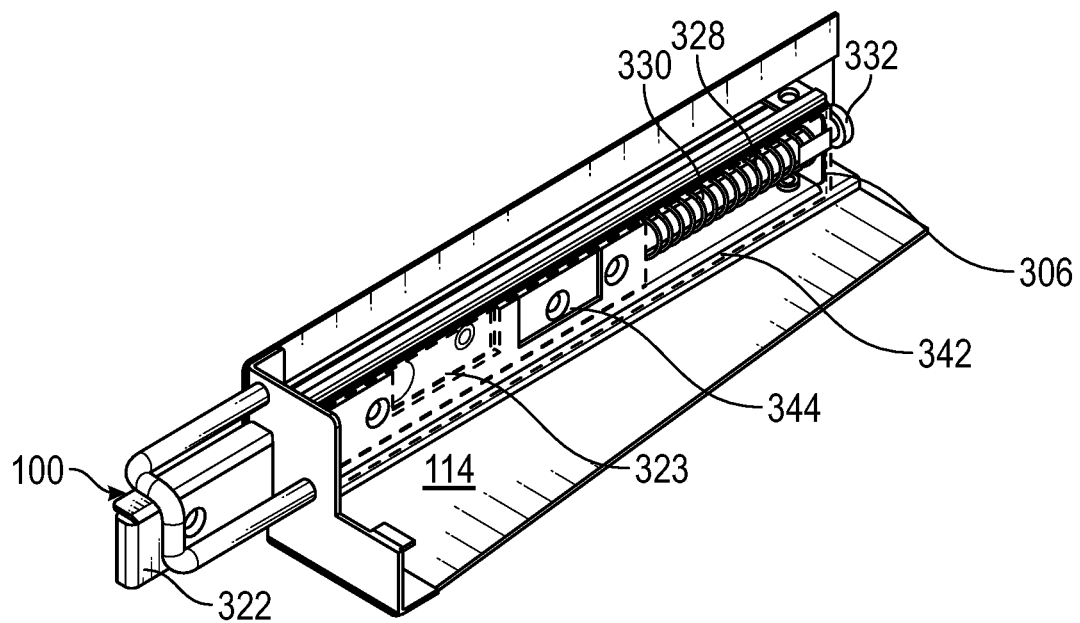
FIG. 6B is an upper right-side perspective view of the first embodiment of a latch and a section of a chassis in the closed state of FIG. 6A with part of the latch rendered partially transparent to illustrate the inner workings.

FIG. 6B further illustrates the closed state of FIG. 6A with part of latch 100 rendered partially transparent to illustrate the inner workings. In FIG. 6B, with handle 322 extended, spring 328 is relatively uncompressed.

Figure 6C:
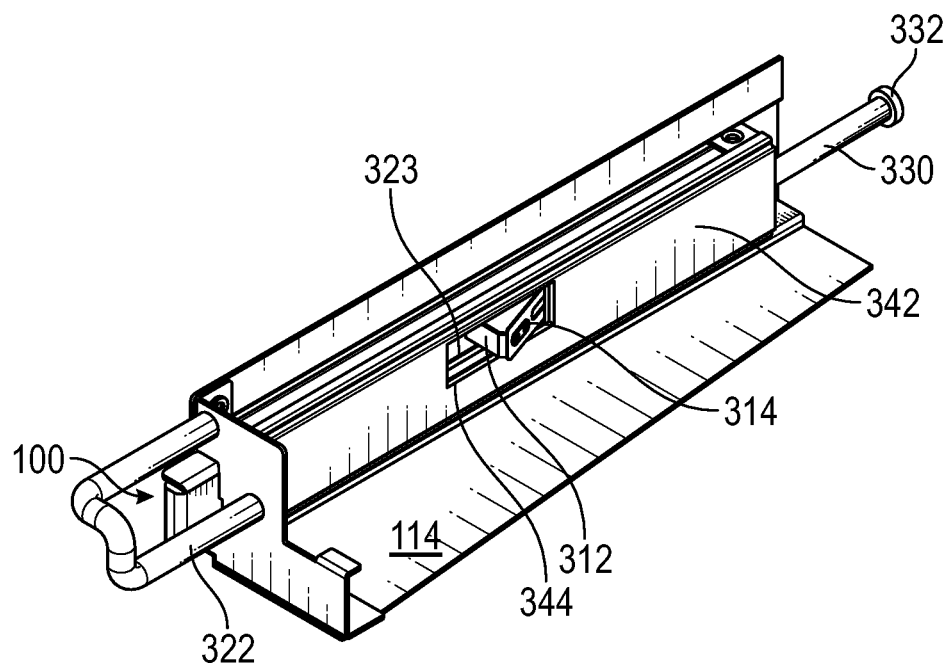
FIG. 6C is an upper right-side perspective view of the first embodiment of a latch in an open state and a section of a chassis.

FIG. 6C is an upper right-side perspective view of latch 100 in an open state and a section of chassis 114. The configuration of FIG. 6C corresponds to the configuration and description of FIGS. 4C, 5A, 5F, and 5G. FIG. 6C illustrates that in the open position, handle window 323 aligns with cover window 344, allowing leaf spring 314 and tooth 312 to retract partially into the interior of chassis 114.

Figure 6D:
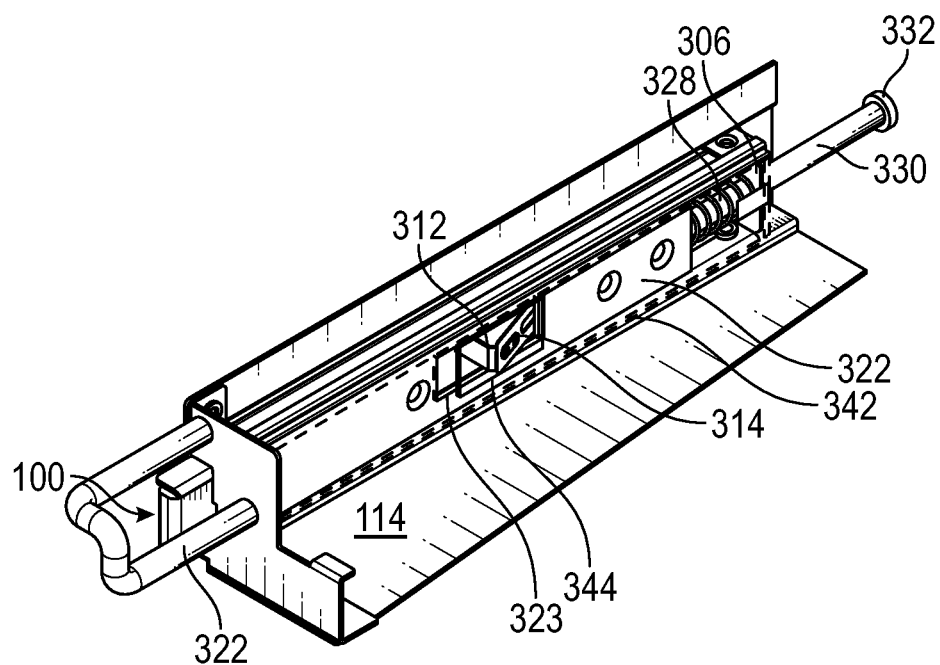
FIG. 6D is an upper right-side perspective view of the first embodiment of a latch and a section of a chassis in the open state of FIG. 6C with part of the latch rendered partially transparent to illustrate the inner workings.

FIG. 6D further illustrates the open state of FIG. 6C with part of latch 100 rendered partially transparent to illustrate the inner workings. In FIG. 6D, with handle 322 depressed, spring 328 is also compressed between housing end plate 306 and actuator 324.

Figure 6E:
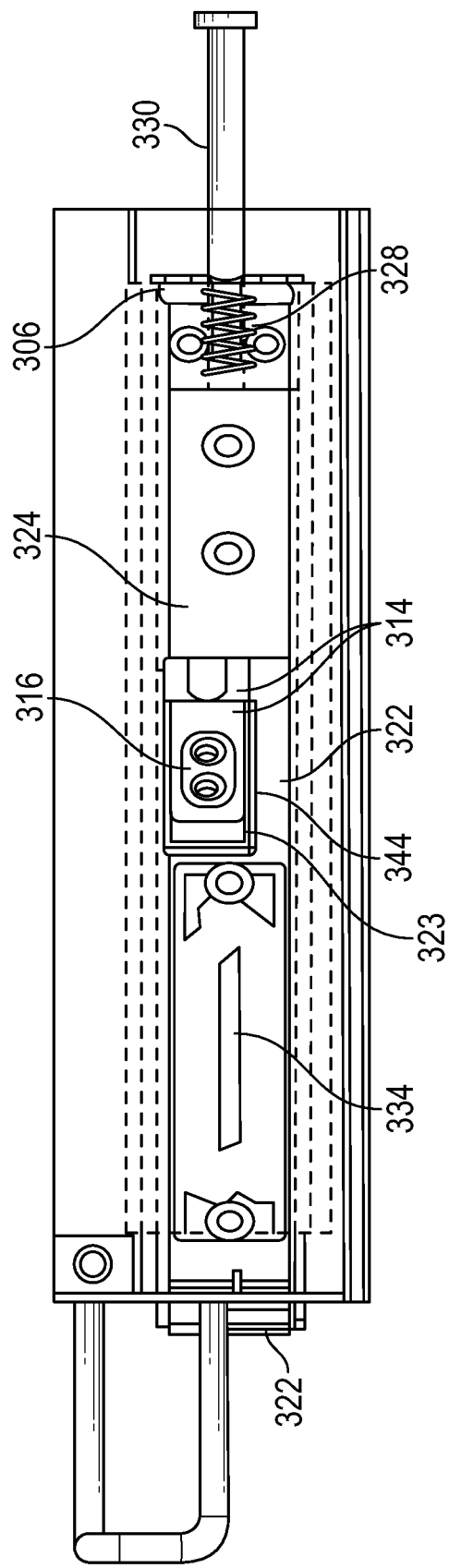
FIG. 6E is a right-side view of the first embodiment of a latch and a section of a chassis in the open state of FIG. 6C with part of the latch rendered partially transparent to illustrate the inner workings.

FIG. 6E is a right-side view further illustrating the open state of FIG. 6C and FIG. 6D. FIG. 6E further illustrates the alignment of handle window 323 with cover window 344 that allows leaf spring 314 to pass through the aligned windows. FIG. 6E also further illustrates the compression of spring 328 about guide pin 330.

Figure 7C:
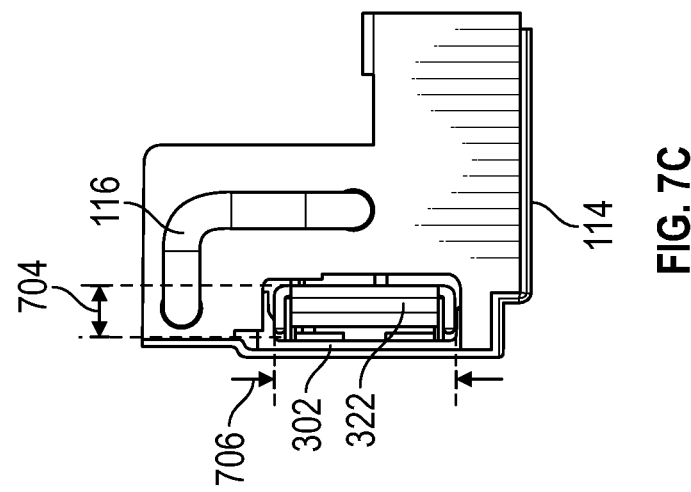
FIG. 7C is a front view of the first embodiment of a latch in an open state and a section of a chassis.
Figure 7A:
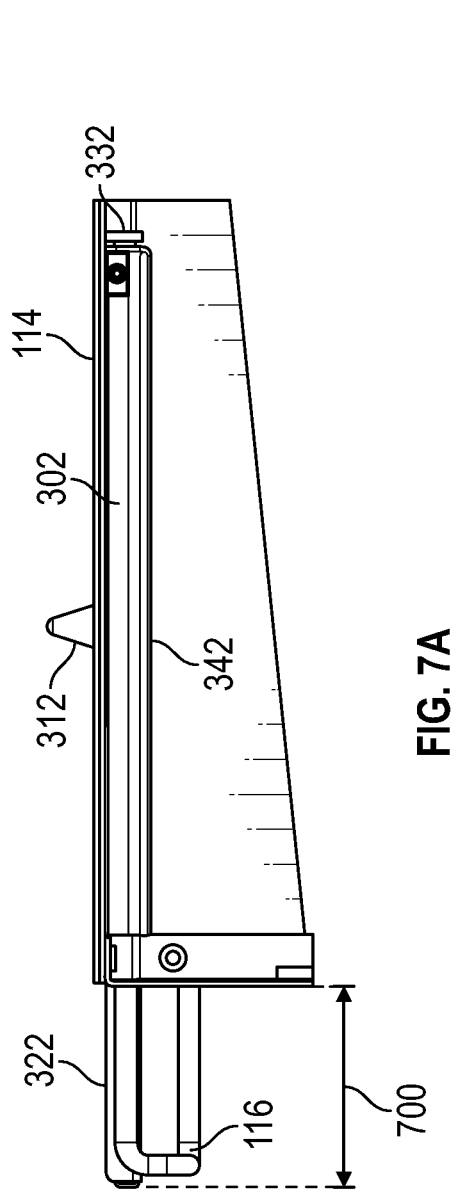
FIG. 7A is a top view of the first embodiment of a latch in a closed state and a section of a chassis.

FIG. 7A is a top view of latch 100 in a closed state and a section of chassis 114. The configuration of FIG. 7A corresponds to the configuration and description of FIGS. 4A, 5D, 5H, and 5I, and 6A. FIG. 7A illustrates that in the closed position, tooth 312 extends outwardly from chassis 114. In an embodiment, handle 322 extends a distance 700 from chassis 114 in the closed position. In an embodiment, distance 700 is 47.88 mm.

Figure 7B:
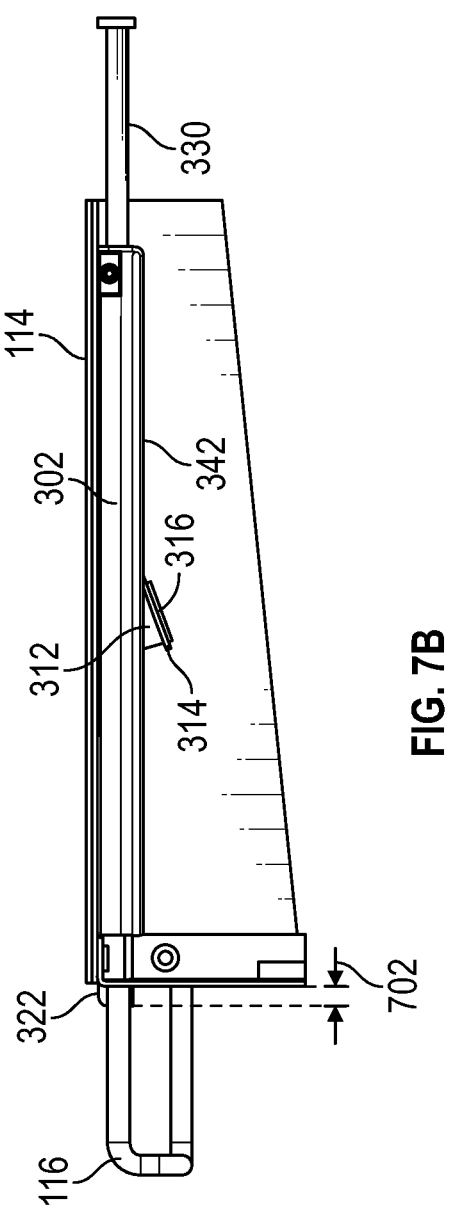
FIG. 7B is a top view of the first embodiment of a latch in an open state and a section of a chassis.

FIG. 7B is a top view of latch 100 in an open state and a section of chassis 114. The configuration of FIG. 7B corresponds to the configuration and description of FIGS. 4C, 5A, 5F, 5G, and 6C. FIG. 7B illustrates that in the open position, tooth 312 is retained within chassis 114. In an embodiment, the distance from the exterior of chassis 114 to the innermost point of washer 316 on leaf spring 314 is 16 mm. In an embodiment, the distance from the exterior of chassis 114 to the innermost point of cover 342 is 12.25 mm. In an embodiment, handle 322 extends a distance 702 from chassis 114 in the open position. In an embodiment, distance 702 is 6.21 mm.

FIG. 7C is a front view of latch 100 in the open state of FIG. 7B. The configuration of FIG. 7C illustrates that in the open position, tooth 312 is retained within chassis 114. In an embodiment, a height 706 of handle 322 is 19.73 mm and a width 704 of handle 322 is 6 mm.

Figure 8A:
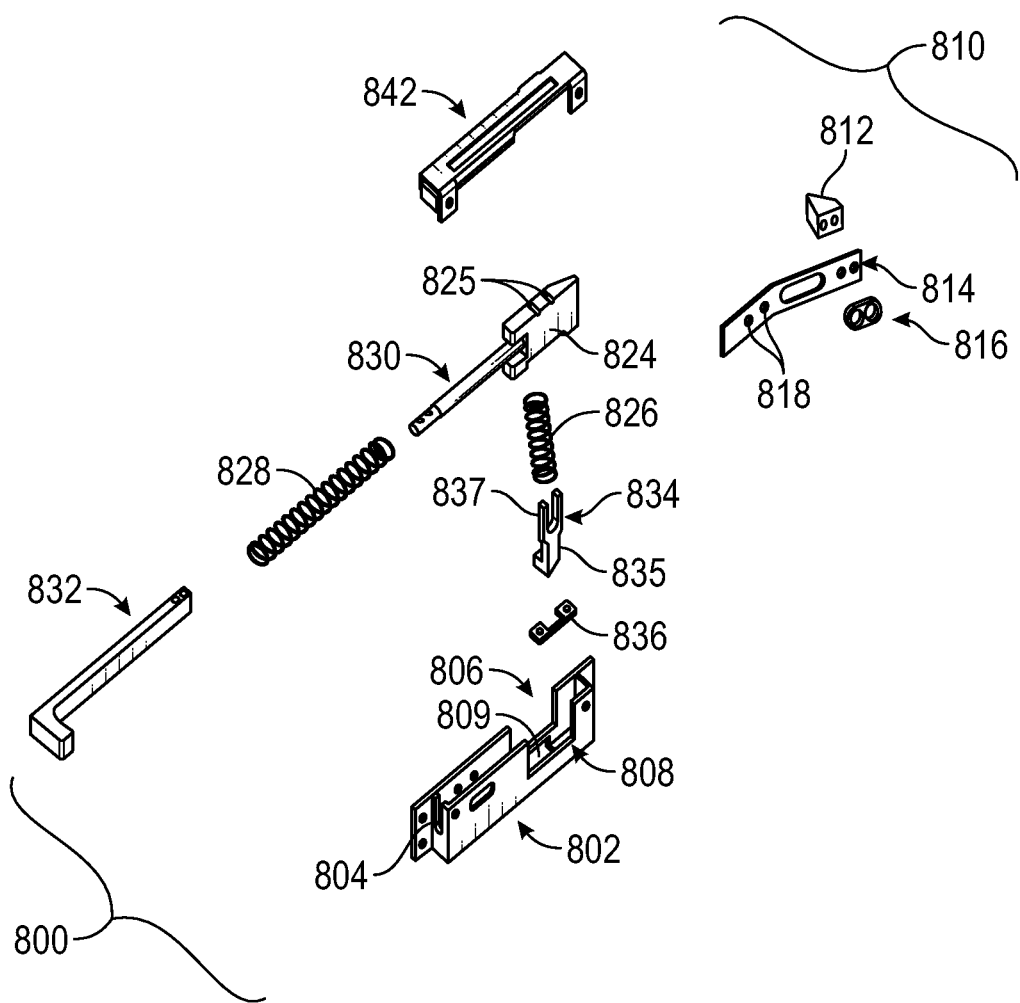
FIG. 8A is an expanded assembly drawing of a second embodiment of a latch.

FIG. 8A is an expanded assembly drawing of a second embodiment of latch 800. In this embodiment, latch 800 may be used in a chassis 850 of server 106 (described earlier). Chassis 850 may be the same as chassis 114 of the first embodiment, except that chassis 850 may include a front chassis window 854 (FIG. 8B) and a side chassis window 856 that may be proportioned differently from their counterparts described with reference to the first embodiment. Furthermore, chassis 850 may include a trigger window 852 not found in chassis 114.

As with latch 100 and latch 102, which were mirror images of each other, the second embodiment described with reference to latch 800 includes a mirror image of latch 800. Latch 800 is described with reference to the left side of chassis 850. The corresponding mirror-image of latch 800, for the right side of chassis 850, is not described for brevity. The description of latch 800 applies equally to its mirror image.

A further consistency between the first and second embodiments of the latch is that an actuator deforming a leaf spring causes a tooth to extend from the chassis.

In FIG. 8A, a tooth assembly 810 includes a tooth 812 attached to a leaf spring 814 partly using a washer 816 and appropriate fasteners (not shown). Leaf spring 814 has holes 818 for fasteners to attach tooth assembly 810 to corresponding holes (not shown) within a housing 802 and on the side of housing 802 that is closest to chassis 850. Leaf spring 814, in its resting, less-deformed state, includes a bend between holes 818 and tooth 812. In this configuration, when tooth assembly 810 is mounted to housing 802, tooth 812 is positioned next to, but does not protrude through a slot 806 in housing 802. When leaf spring 814 is deformed by being flattened toward the outboard side of housing 802, tooth 812 passes through slot 806 to engage the corresponding latch keeper, i.e., edge 122 of window 110 (FIG. 1D). Housing 802 further includes a slot 804 disposed at a front end, a slot 808 disposed on an inboard side, and a slot 809 disposed on a bottom side. Slot 809 may run for the entire length of the bottom of housing 802.

Latch 800 further includes a handle 832 that is connected to an actuator or "wedge" 824, by a guide pin 830. An actuator spring 828 is about guide pin 830. When assembled, actuator 824 is positioned within housing 802 with guide pin 830 passing through slot 804. Actuator spring 828 is also within housing 802 and is compressed between the front end of housing 802 (with slot 804) and actuator 824. Thus assembled, actuator 824 is sandwiched between sides of housing 802 and constrained to travel linearly forward and backward within housing 802, with actuator spring 828 urging actuator 824 towards the rear.

Latch 800 is opened by causing actuator 824 to travel forward within housing 802. At the limit of the travel forward, actuator 824 has depressed actuator spring 828 against housing 802 and actuator 824 is positioned next to holes 818. This position of actuator 824 allows leaf spring 814 to return to its less-deformed shape and retract tooth 812 from housing slot 806. With spring 814 retracted, tooth 812 extends inwardly through housing slot 808.

Latch 800 is closed by allowing actuator spring 828 to urge actuator 824 to the rear of housing 802, which deforms leaf spring 814, pushing leaf spring 814 outwardly toward housing slot 806. At the limit of the rearward travel actuator 824 has moved behind leaf spring 814 enough to cause leaf spring 814 to deform and push tooth 812 through housing slot 806.

Latch 800 further includes a trigger 834 that extends from the bottom of actuator 824. Trigger 834 fits within a recess within actuator 824 (see FIG. 8C) and includes tines 837 that slide within holes 825 at the top of recess 827 of actuator 824. Trigger 834 is urged out of recess 827 and away from actuator 824 by a trigger spring 826, which is placed between tines 837 and constrained to remain there by the sides of recess 827. Trigger 834 and spring 826 are retained within the recess by a trigger retainer 836, which has an opening large enough to allow the tip of trigger 834 to pass through, but not large enough to allow a shoulder 838 of trigger 834 to pass through.

Figure 8B:
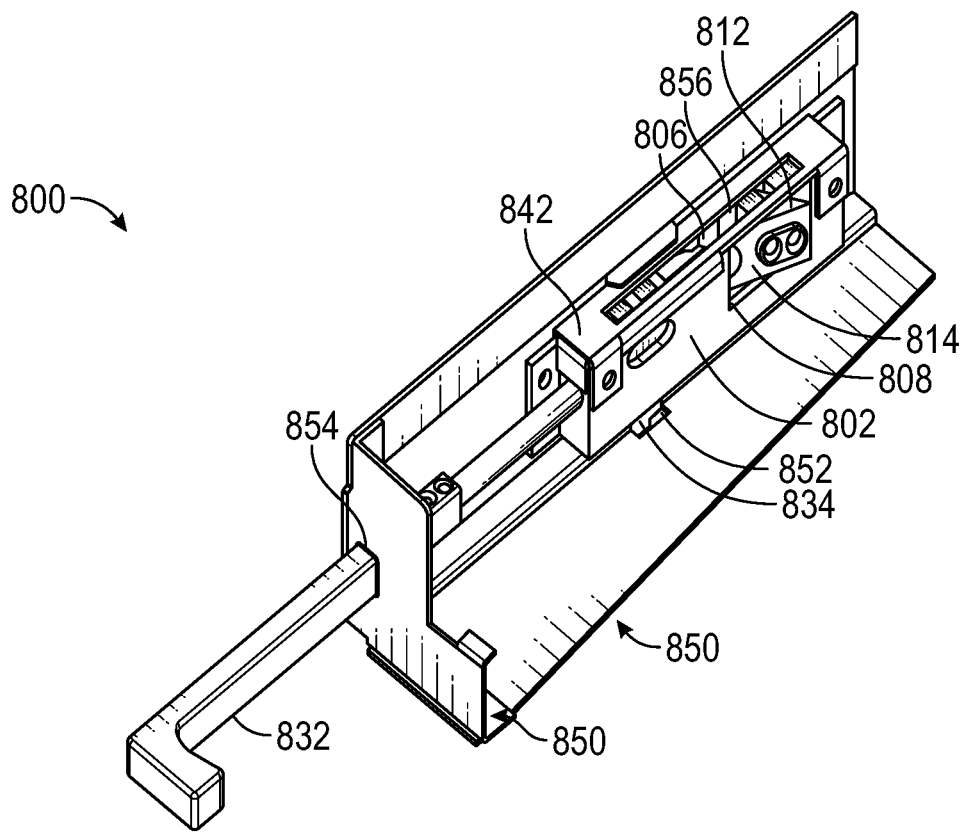
FIG. 8B is a perspective view of the second embodiment of a latch and a section of a server chassis.
Figure 8C:
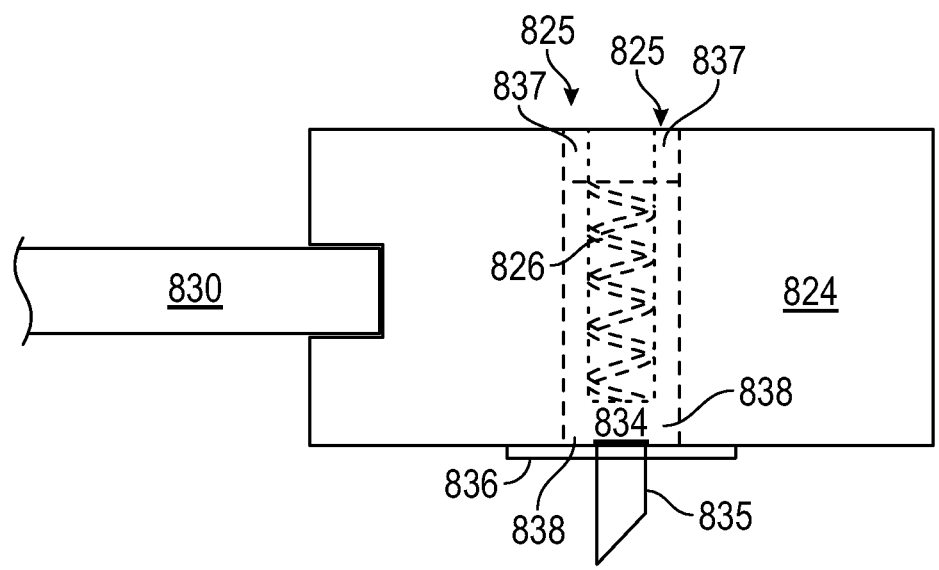
FIG. 8C is a side view of certain elements of the second embodiment of a latch.

FIG. 8B is a perspective view of latch 800 and a section of server chassis 850. In FIG. 8B, latch 800 is in the open position with handle 832 extending from chassis 850 through chassis window 854 in the front of chassis 850. The extension of handle 832 is limited by the compression of spring 828 between actuator 824 and housing 802. In this open state, tooth 812 is withdrawn from slot 806 and chassis window 856 and extends partially through slot 808 into the interior of chassis 850. Actuator 824 is in the forward section of housing 802, allowing leaf spring 814 to relax and withdraw tooth 812 from chassis window 856. Trigger 834 extends into trigger window 852, which maintains latch 800 in the open state until trigger 834 is depressed. In this position, when trigger 834 is depressed, spring 828 will cause latch 800 to close as follows. Spring 828 will urge actuator 824 rearward. In turn actuator 824 will deform leaf spring 814 causing tooth 812 to extend through housing slot 806 and chassis window 856 and outwardly from chassis 850.

FIG. 9A is a top view of latch 800 in an open state and a section of chassis 850. The configuration of FIG. 9A corresponds to the configuration and description of FIG. 8B. FIG. 9A illustrates that in the open position handle 832 extends a distance 900 from chassis 850. In an embodiment, distance 900 is 83 mm. With handle 832 extended, leaf spring 814 and tooth 812 extend inwardly through housing slot 808. Spring 828 is compressed, but is not shown in this figure. FIG. 9A also illustrates that, when latch 800 is open, actuator 824 has moved forward enough within housing 802 to allow leaf spring 814 to relax and retract tooth 812. In addition, chassis 850 is visible through cover 842 and through slot 809, indicating the extent that housing slot 809 runs to the rear of housing 802.

FIG. 9B is a side view of latch 800 in the open state of FIG. 9A and a section of chassis 850. In FIG. 9B, trigger 834 is shown holding latch 800 in the open state with trigger edge 835 abutting a chassis tooth-engaging edge 858 of chassis window 852. Thus engaged, trigger 834 maintains actuator 824 in the forward section of housing 802 and leaf spring 814 in the undeformed state. The tip of trigger 834 extends below chassis 850. Thus, when chassis 850 is slid onto a rack shelf, contact may be made between the rack shelf and trigger 834. This contact will force trigger 834 up and into actuator 824, causing trigger edge 835 to lose contact with chassis edge 858, which releases trigger 834. Spring 828 then is freed to urge actuator 824 rearward. FIG. 9B further illustrates that housing window 806 and chassis window 856 align sufficiently enough to allow tooth 812 to pass thorough chassis window 856. In the embodiment, handle 832 has a height 904. In an embodiment height 904 may be 8 mm and the width of the shorter part of the "L" of handle 832 may be 25 mm.

FIG. 9C is a rear view of latch 800 in the open state of FIGS. 9A and 9B and a section of chassis 850. FIG. 9C illustrates that in the open position, tooth 812 extends inwardly from housing 802 and does not extend outwardly from chassis 850. Furthermore, trigger 834 is shown to extend through and below chassis 850.

FIG. 9D is a top view of latch 800 in a closed state and a section of chassis 850. FIG. 9D illustrates that in the closed position handle 832 extends a distance 902 from chassis 850. In an embodiment, distance 902 is 41 mm. With handle 832 depressed to the closed position, leaf spring 814 is deformed to be sufficiently flat against the side of housing 802 and tooth 812 is extended outwardly through housing slot 806 and chassis window 856. Spring 828 is less-compressed. FIG. 9D also illustrates that when latch 800 is closed actuator 824 has moved rearward sufficiently within housing 802 to cause leaf spring 814 to deform extend tooth 812 outwardly from chassis 850.

FIG. 9E is a side view of latch 800 in the closed state of FIG. 9D and a section of chassis 850. In FIG. 9E, trigger 834 is shown released from chassis window 852 and in contact with an interior surface of chassis 850. In the embodiment, trigger 834 is released by being depressed upwardly using, e.g., by the user's finger, or a small implement, or by chassis 850 being installed in a shelf of a server rack. Trigger 834 thus moves further within actuator 824 as shown by tines 837 extending from above actuator 824. FIG. 9E illustrates that trigger 834, when not extended into window 852, travels with the movement of actuator 824 forward and backward within housing slot 809 and along an interior surface of chassis 850. During most of such fore and aft travel, the tip of trigger 834 runs along the surface of chassis 850 until handle 832 is extended to the open position and trigger 834 aligns with trigger window 852. When so aligned, trigger 834 is then urged by spring 826 to extend through trigger window 852 (see, e.g., FIG. 9B), which holds latch 800 in the open state with trigger edge 835 abutting a chassis tooth-engaging edge 858 of chassis window 852.

FIG. 9F is a rear view of latch 800 in the closed state of FIG. 9D and FIG. 9E and a section of chassis 850. FIG. 9F illustrates that in the closed position, tooth 812 extends outwardly from chassis 850. Furthermore, trigger 834 does not extend through and below chassis 850.

FIG. 10A through 10D illustrate the installation of chassis 850 onto a rack shelf 1002, also known as a "friction rail."

Figure 10A:
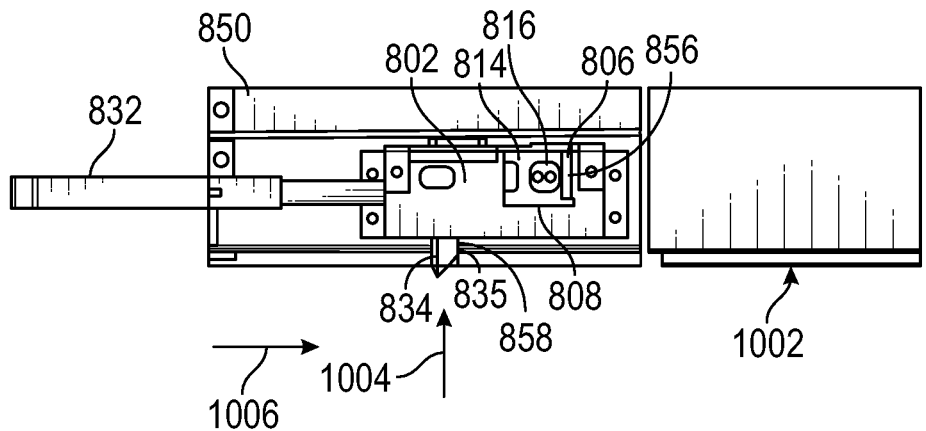
FIG. 10A is a right-side view of the second embodiment of a latch in an open state and a section of a chassis and a section of server rack.

FIG. 10A is a right-side view further illustrating the open state of FIG. 9A and FIG. 9B before installation. FIG. 10A illustrates the alignment of housing slot 806 with chassis window 856 that allows leaf spring 814 to pass through the aligned windows. The tip of trigger 834 extends below chassis 850. Thus, when chassis 850 is slid in the direction of arrow 1006 onto rack shelf 1002, contact is made between rack shelf 1002 and trigger 834. This contact forces force trigger 834 up in the direction of arrow 1004 and into actuator 824, causing trigger edge 835 to lose contact with chassis edge 858, which releases trigger 834. Spring 828 then is freed to urge actuator 824 rearward.

Figure 10B:
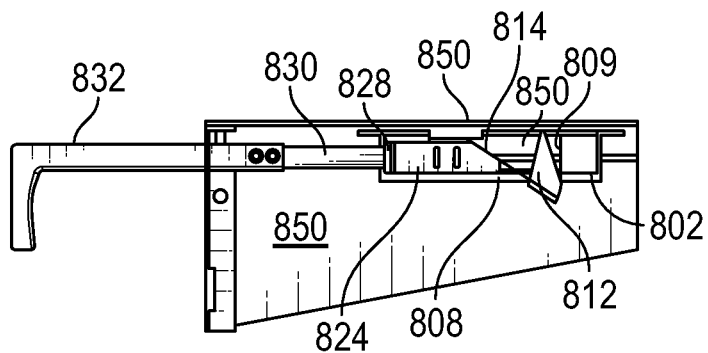
FIG. 10B is a top view of the second embodiment of a latch in an open state and a section of a chassis with part of the latch rendered invisible to show the inner workings.

FIG. 10B is a top view further illustrating the open state of latch 800 of FIG. 10A with part of latch 800 rendered partially transparent to illustrate the inner workings. FIG. 10B illustrates that in the open position, actuator 824 has moved forward enough within housing 802 to allow leaf spring 814 to relax and retract tooth 812 through housing slot 80 and into chassis 850. FIG. 10B also further illustrates the compression of actuator spring 828 about guide pin 830. In addition, chassis 850 is visible through housing slot 809, indicating the extent that housing slot 809 runs to the rear of housing 802.

With the release of trigger 834, latch 800 transitions between fully open to fully closed. Trigger 834 slides along the interior surface of chassis 850, urged against chassis 850 by spring 826 (FIG. 8A). Actuator 824 is urged against spring 814 and causes spring 814 to deform, but until tooth 812 aligns with chassis window 856, tooth 812 cannot fully extend outwardly and must slide along an interior surface of chassis 850. With tooth 812 against the interior surface of chassis 850, and the outward extension of tooth 812 thus inhibited, spring 814 cannot deform further and the rearward motion of actuator 824 is halted until tooth 812 aligns with chassis window 856. When aligned, tooth 812 passes through chassis window 856, allowing spring 828 to push actuator 824 rearward to the fully closed position.

Figure 10C:
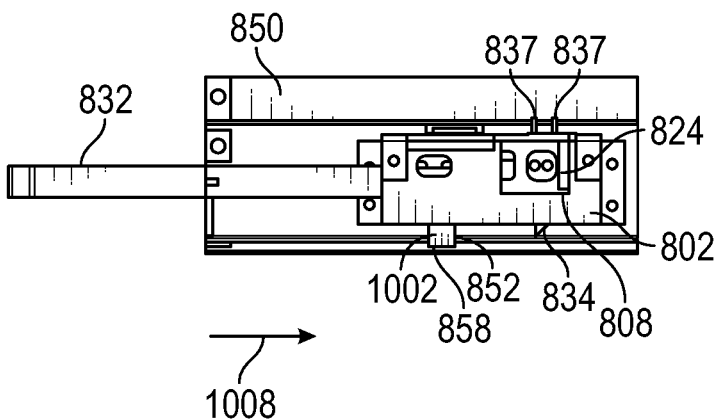
FIG. 10C is a right-side view of the second embodiment of a latch in a closed state and a section of a chassis and a section of server rack.

FIG. 10C is a right-side view further illustrating the closed state of FIG. 9C and FIG. 9D after installation. FIG. 10C illustrates that in the closed position, handle 832 abuts housing 802. With chassis 850 installed and latch 800 closed, trigger 834 is no longer within trigger window 852, having been released by contact with rack shelf 1002 during the installation and pushed rearward by the de-compression of spring 828. The contact with rack shelf 1002 pushed trigger 834 up and further within actuator 824 as shown by tines 837 extending from above actuator 824. For this reason, rack shelf 1002 is visible through trigger window 852. Spring 828 also forced actuator 824 rearward to the point actuator 824 covers housing slot 808.

Figures 10D, 10E:
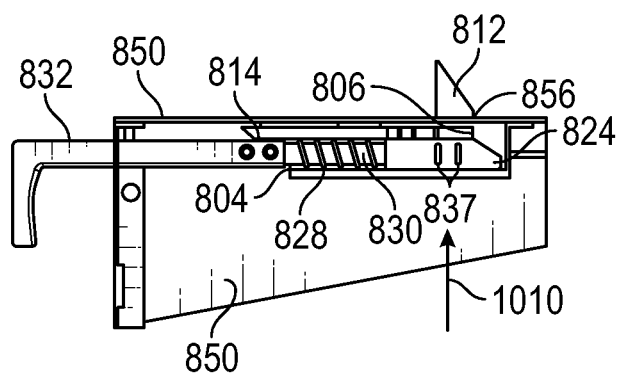
FIG. 10D is a top view of the second embodiment of a latch in an open state and a section of a chassis with part of the latch rendered invisible to show the inner workings.
FIG. 10E is a top view of the second embodiment of a latch in an open state and a section of a chassis and a section of server rack with part of the latch rendered invisible to show the inner workings.

FIG. 10D is a top view of latch 800 that further illustrates the closed state of FIG. 10C with part of latch 800 rendered partially transparent to illustrate the inner workings. In FIG. 10D, with handle 832 depressed, spring 828 is relatively less-compressed between housing slot 804 and actuator 824. Tooth 812 extends outwardly from chassis 850. In the fully closed position actuator 824 blocks housing slot 808, preventing leaf spring 814 and tooth 812 from retracting and tooth 812 from being dislodged by a force that would tend to remove chassis 850 from shelf 1002, e.g., a seismic event. From this closed position, to return latch 800 to the open position of FIG. 10A requires the user to pull on handle 832 until trigger 834 aligns with trigger window 852.

In the first and second embodiments, actuators 324, 824 are generally shown as having wedge shapes where the actuator makes contact with the leaf spring. However, in other embodiments other shapes may be used to make such contact. For example, the actuator could be rounded, or a combination of rounded and wedge shaped, as shown in FIG. 5G and FIG. 5I. Similarly, the actuator may be blunt or have another shape. So long as the shape allows the actuator to pass over and deform the leaf spring, and also support the tooth when in the closed position, the shape may be used.

In the first and second embodiments, springs 328, 828 are shown as being coil springs. However, in other embodiments, the biasing of the actuator in a given direction may be brought about using a different resilient device, such as an elastic band, or a compressible and resilient polymer.

Similarly, in the first and second embodiments, springs 314 and 814 are shown as being leaf springs. However, in other embodiments, the biasing of tooth in the retracted position may be brought about using other mechanisms. For example, leaf spring 314 could be replaced by a rigid element with a hinge at the bend. An elastic band or coil spring could then be used to pull the tooth into the chasses, with the tooth on the rigid element and the rigid element pivoting inward about the hinge.

In the first and second embodiments, housings 302, 802 are shown as being separate from chassis 114, 850, respectively. However, in other embodiments, one or more of the features of housings 302, 802 could be incorporated or integrated directly into the chassis.

In the first and second embodiments, springs 314 and 814 are generally discussed as being "deformed" when the latch is in the closed position and "relaxed" or "undeformed" when the latch is in the open position. However, it should be noted that the difference between deformed and relaxed is relative and that these should be understood to mean that the spring may be somewhat deformed in the open position and more deformed in the closed position with the difference between the two levels of deformation being reflected in the tooth being extended or retracted in the amount desired.

In the first and second embodiments, teeth 312 and 812 are shown to be wedge-shaped. However, in other embodiments, springs 314 and 814 are generally discussed as being "deformed" when the latch is in the closed position and "relaxed" or "undeformed" when the latch is in the open position.

In an embodiment, a latch includes: a tooth; a leaf spring; a housing; an actuator; and a handle. In the embodiment: the actuator is connected to the handle and is moveable by the handle between a first position and a second position with respect to the housing; the leaf spring is connected to the housing; and the tooth is connected to the leaf spring such that, when the actuator is in the first position the leaf spring is in a less-deformed state that positions the tooth in a retracted position with respect to the housing, and, when the actuator is moved from the first to the second position the actuator deforms the leaf spring causing the tooth to extend from the housing.

It is understood that any specific order or hierarchy of steps in the processes disclosed is an illustration of approaches. Based upon design preferences, it is understood that the specific order or hierarchy of steps in the processes may be rearranged, or that all illustrated steps be performed. Some of the steps may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising: a tooth connected to a leaf spring that is connected to a housing; a handle linearly moveable between an open position and a closed position; and an actuator connected to the handle and including a first spring coiled about a straight pin, the actuator being linearly moveable by the handle between a first position and a second position relative to the housing such that when the actuator is in the first position the leaf spring is in a less-deformed state and causes the tooth to be in a retracted position relative to the housing and when the actuator moves from the first to the second position the actuator deforms the leaf spring causing the tooth to extend from the housing, the first spring being compressed along the straight pin between the actuator and the housing when the actuator moves from the second position to the first position such that the first spring biases the actuator toward the second position and the actuator covering a full width of the leaf spring in the second position.

2. The apparatus of claim 1 further comprising a mating surface positioned with respect to the housing such that the tooth, when extended from the housing, is inhibited from moving in at least one direction by the mating surface.

3. The apparatus of claim 2, wherein the mating surface is an edge of a shelf opening.

4. The apparatus of claim 1, wherein the housing includes a first housing opening and the leaf spring is positioned such that:
   moving the actuator from the first to the second position causes the leaf spring to deform and cause the tooth to pass through the first housing opening.

5. The apparatus of claim 4 further comprising:
   a cover including a cover opening, wherein:

the handle includes a handle opening and is sandwiched between the cover and the housing;

moving the actuator from the second position to the first position causes the leaf spring to become less deformed and the leaf spring and tooth to pass at least partially through the handle opening and the cover opening.

6. The apparatus of claim 4 further comprising:

a first resilient device configured to urge the actuator toward the second position.

7. The apparatus of claim 6, wherein the first resilient device is a spring disposed between an end of the housing and the actuator.

8. The apparatus of claim 6, wherein the first resilient device is a spring or an elastic band.

9. The apparatus of claim 1, wherein the housing is integrated into a chassis.

10. The apparatus of claim 1, wherein the housing is connected to an interior of a chassis having a first chassis opening, the tooth passing at least partially through the first chassis opening when the actuator is moved from the first to the second position.

11. The apparatus of claim 1 further comprising an arm with a pin, the arm pivoting to allow the pin to follow a track having first and second pin-retaining positions, the arm and track connected between the housing and the handle, wherein:

when the pin is in the first pin-retaining position, the relative positions of the handle, track, arm, and housing position the actuator in the first position; and when the pin is in the second pin-retaining position, the relative positions of the handle, track, arm, and housing position the actuator in the second position.

12. The apparatus of claim 4, wherein the housing includes a second housing opening such that moving the handle from the second position to the first position causes the leaf spring to return to the less-deformed state and the leaf spring and tooth to pass at least partially through the second housing opening.

13. The apparatus of claim 12 further comprising a trigger moveably connected to the actuator and a second resilient device configured to urge the trigger away from the actuator, wherein:

the housing includes a third housing opening positioned to admit the trigger when the actuator is in the first position, the trigger, when admitted by the third housing opening, engaging an edge of the third housing opening and resisting movement of the actuator from the first position to the second position.

14. The apparatus of claim 13, wherein the housing is integrated into a chassis.

15. The apparatus of claim 13, wherein the housing is connected to an interior of a chassis having a first chassis opening, the tooth passing through the first chassis opening when the actuator is moved from the first to the second position.

16. The apparatus of claim 12, wherein:

the housing is connected to an interior of a chassis having a first chassis opening and a second chassis opening;

the tooth passes at least partially through the first chassis opening when the actuator is moved from the first to the second position;

the handle moves within the second chassis opening as the actuator moves between the first and second positions, the apparatus further comprising:

a trigger moveably connected to the handle and a second resilient device configured to urge the trigger away from the handle, wherein:

when the actuator is in the first position, the trigger is positioned exterior to the chassis and is urged by the second resilient device away from the handle such that the trigger resists movement of the handle into the chassis by engaging an exterior of the chassis.

\* \* \* \* \*